United States Patent
Liao et al.

(10) Patent No.: US 9,352,466 B2
(45) Date of Patent: May 31, 2016

(54) ROBOT POSITIONING SYSTEM FOR SEMICONDUCTOR TOOLS

(75) Inventors: Wen-Huang Liao, Zhubei (TW); Hsien-Mao Huang, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 565 days.

(21) Appl. No.: 13/486,019

(22) Filed: Jun. 1, 2012

(65) Prior Publication Data

US 2013/0325179 A1    Dec. 5, 2013

(51) Int. Cl.
*B25J 9/16* (2006.01)
*H01L 21/67* (2006.01)
*H01L 21/68* (2006.01)
*G06K 9/32* (2006.01)

(52) U.S. Cl.
CPC .............. *B25J 9/1697* (2013.01); *B25J 9/1692* (2013.01); *H01L 21/67259* (2013.01); *H01L 21/681* (2013.01); *G05B 2219/39008* (2013.01); *G05B 2219/39046* (2013.01); *G05B 2219/45031* (2013.01); *G06K 9/3208* (2013.01)

(58) Field of Classification Search
CPC . H01L 21/681; H01L 21/68; H01L 21/67259; H01L 21/67265; B25J 9/1697; B25J 9/1692
USPC ................. 700/245, 250, 253, 254, 258, 259; 901/2, 9, 47, 50; 414/935–941; 382/151, 153
See application file for complete search history.

(56) References Cited

U.S. PATENT DOCUMENTS

| | | | |
|---|---|---|---|
| 5,513,948 A | 5/1996 | Bacchi et al. | |
| 6,105,454 A | 8/2000 | Bacchi et al. | |
| 7,205,742 B2 * | 4/2007 | Adachi et al. | 318/567 |
| 2004/0202362 A1 * | 10/2004 | Ishikawa et al. | 382/153 |
| 2006/0106497 A1 * | 5/2006 | Ishikawa et al. | 700/259 |
| 2007/0189596 A1 * | 8/2007 | Lee et al. | 382/151 |
| 2008/0097646 A1 * | 4/2008 | Ramsey et al. | 700/258 |

OTHER PUBLICATIONS

"Simple and Friendly Clean Robot", Kawasaki Heavy Industries Ltd., www.khi.co.jp/robot/, 6 pages.

* cited by examiner

*Primary Examiner* — Spencer Patton
(74) *Attorney, Agent, or Firm* — Duane Morris LLP

(57) ABSTRACT

A system and method for adjusting the position and orientation of a feed arm associated with a wafer handling robot. In one embodiment, the system includes a positioning plate detachably carried by the feed arm and insertable therewith into a wafer carrier. The positioning plate includes graphic alignment indicia. An alignment apparatus is provided configured for insertion into wafer-holding slots in the wafer carrier. The apparatus includes at least one digital image sensor. With the positioning plate and alignment apparatus located in the wafer carrier, an image of the alignment indicia is displayed on a video monitor by the image sensor for comparison to a reference mark superimposed on the monitor for determining the relative position and orientation of the feed arm with respect to the wafer carrier. Some embodiments of the apparatus further include a distance detection device to measure the distance to the plate.

22 Claims, 23 Drawing Sheets

ROBOT POSITIONING SYSTEM FOR SEMICONDUCTOR TOOLS

TECHNICAL FIELD

The present disclosure generally relates to semiconductor manufacturing machines or tools, and more particularly to an system and method for adjusting wafer handling robot movement.

BACKGROUND

Multiple wafers are typically stored and transported together in batches by a wafer carrier throughout a semiconductor fabrication facility ("fab") between the loadports of different wafer processing tools or equipment. Such tools generally perform various photolithography, etching, material/film deposition, curing, annealing, inspection, or other processes used in IC chip manufacturing. One such wafer carrier commonly used is a front opening unified pod (FOUP) which can hold a plurality of wafers ranging from 200 mm (8 inch) to larger 450 mm (18 inch) sizes. Typically, each wafer carrier holds on the order of approximately 25 wafers. The individual wafers are stacked vertically in the FOUP and stored in a wafer support frame having multiple separate wafer shelves or slots.

Wafer processing tools or equipment have motorized robots that are automatically controlled and operated by a programmable computer or processor to retrieve a wafer from the FOUP, load the wafer into the fabrication tool or other equipment, and then return the wafer to the FOUP. These robots have an adjustable motor controller operable to guide movement of a feed arm associated with the robot which are configured with a hand for grasping a wafer. The accuracy with which the robot can physically locate each individual wafer in its respective slot in the wafer carrier for retrieval and re-insertion is important for avoiding physical damage to the wafer such as scratching or chipping upon contact with surfaces in the wafer carrier or other objects.

Before routine operation of the tool or equipment during wafer processing, an initial tool setup procedure is typically performed to "teach" the robot movements in spatial relationship to the location of the slots and wafers to be positioned therein in the FOUP. The setup procedure is therefore used to fine tune and make adjustments to the linear travel, angular orientation, rotational movement, and positioning of the robotic feed arm with respect to the FOUP and anticipated location of the wafer in each slot during normal tool operation. Heretofore, such initial adjustments have sometimes relied on subjective methods based on the experience and expertise of the technicians (i.e. "gut feeling") that the robotic arm positioning adjustments made will result in accurate wafer picks and returns to the FOUP slots. This setup procedure and approach is generally time consuming, cannot be easily replicated, and not sufficiently accurate in all cases to avoid costly wafer damage.

BRIEF DESCRIPTION OF THE DRAWINGS

The features of the embodiments will be described with reference to the following drawings where like elements are labeled similarly, and in which.

Figure 1:
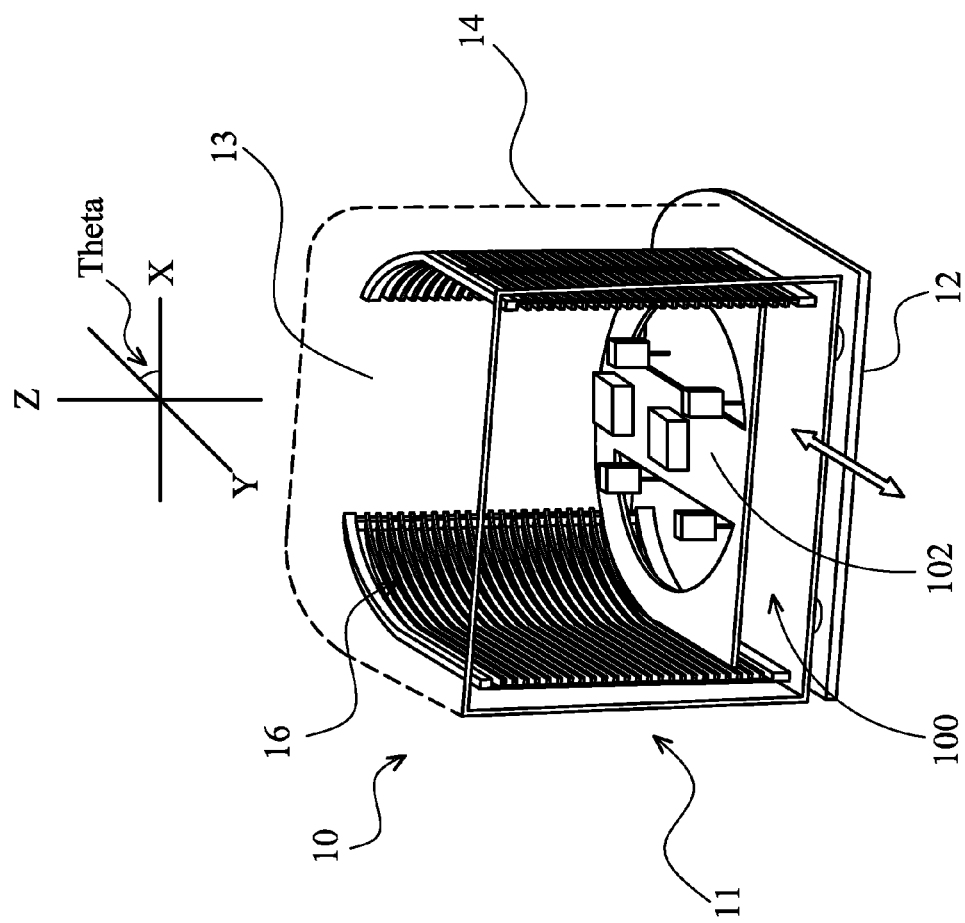
FIG. 1 is a perspective view of a wafer carrier with an exemplary embodiment of an alignment apparatus according to the present disclosure disposed therein.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation.

Terms such as "attached," "affixed," "coupled," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

A system for checking and adjusting the alignment and position of a feed arm associated with a wafer handling robot is disclosed herein. In one embodiment, the system is operable to check the position of the feed arm in at least one plane (e.g. horizontal) and the vertical position of the feed arm with respect to a reference coordinate system. The system is applicable and adaptable for use in conjunction with feed arm position and orientation adjustments for wafer carrier or a semiconductor processing tool chamber, as further described herein.

FIG. 1 shows a wafer carrier in the form of a front opening unified pod or FOUP 10 having a bottom planar base 12, vertically rising housing 14 (represented by dashed lines) attached to the base that includes sidewalls, top, and rear which collectively form an internal cavity 13, and a front opening 11 through the housing for accessing the cavity. The sidewalls, top, and rear of housing 14 may be closed in some embodiments. Front opening 11 may functionally be openable and closeable by the provision of associated hinged doors, seals and other appurtenances (not shown for clarity) that are commonly provided for FOUPs as will be known to those skilled in the art to allow the internal cavity 13 to be maintained as a controlled environment if desired isolated from the ambient fab conditions to prevent contamination of the wafers. Wafer carriers such as FOUPs are commercially-available from various companies, such as for example without limitation Entegris, Inc. of Billerica, Mass. and others.

With continuing reference to FIG. 1, FOUP 10 includes a plurality of vertically arranged horizontal shelves or slots 16 disposed in internal cavity 13 of the FOUP for removably holding a plurality of wafers. The slots 16 are defined by a plurality of vertically spaced apart horizontal surfaces that may be part of a separate wafer support structural frame disposed in the FOUP housing 14 as shown. Each slot 16 is configured for supporting at least a portion of an individual wafer sufficiently to prevent warping or damage to the wafer. In one embodiment, as shown, the slots 16 are configured to support only a peripheral edge portion on opposing sides of each wafer to minimize contact with and damaging the wafer and IC devices being formed thereon as wafers are inserted into or removed from the slots. Any suitable configuration and/or arrangement of slots may be used.

The FOUP 10 and related appurtenances including wafer slots 16 may be formed of any suitable material or combination of materials. Plastics such as transparent or opaque polycarbonate for example are commonly used for fabricating the FOUP housing, base, and wafer slot frame.

Referring to FIG. 1, an arbitrary and non-limiting reference coordinate system may be defined for convenience with respect to the FOUP 10 (and an alignment base 102 as further described below in detail) for establishing relative spatial positions and orientations between a semiconductor processing tool wafer handling robotic feed arm and the wafer holding slots 16. As shown, the coordinate system includes an X-axis, Y-axis, and Z-axis. An angle Theta (θ) defines an angular position or orientation with respect to the X and Y axes. The X-axis defines a horizontal front-to-rear or depth position within FOUP 10. The Y-axis defines a horizontal lateral position within FOUP 10. The Z-axis defines a vertical height position within FOUP 10. This reference coordinate system may be used in conjunction with the positioning system and alignment apparatus according to the present disclosure for pre-adjustment of the wafer handling robot during its initial setup, as further described herein.

Figure 2:
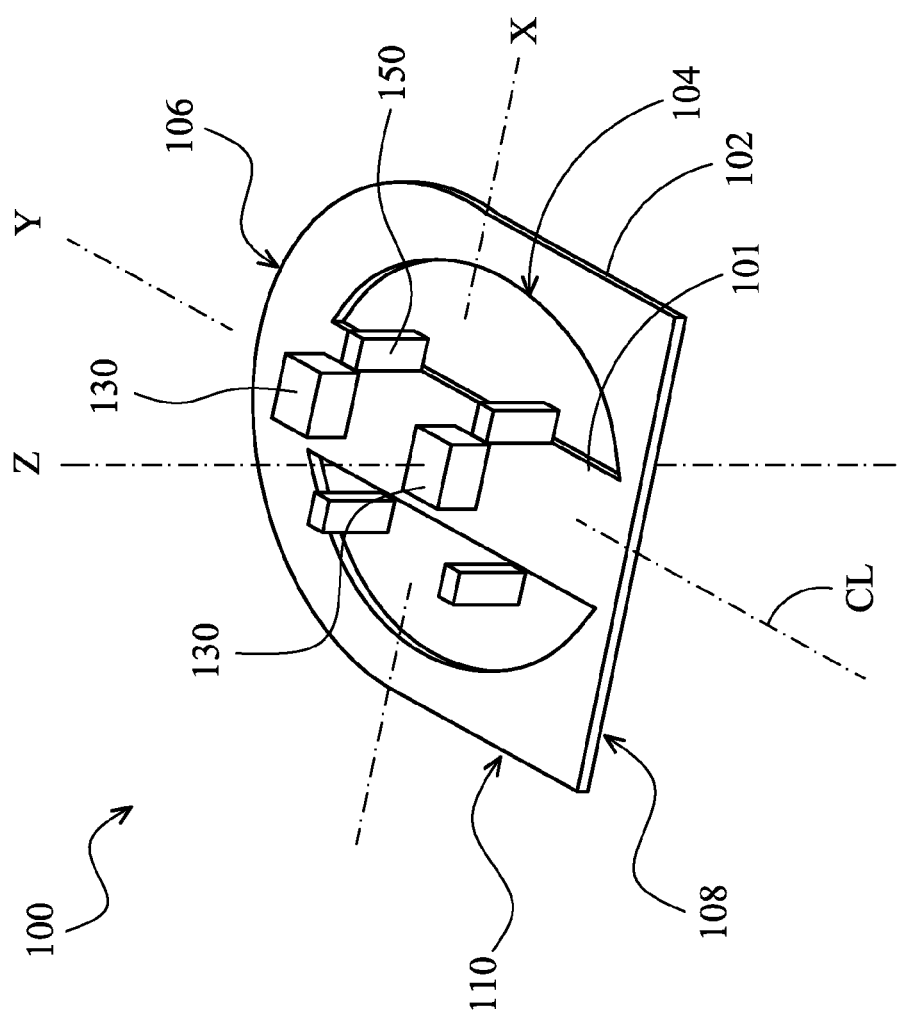
FIG. 2 is a perspective view of the alignment apparatus thereof showing components in greater detail.

Referring to FIGS. 1 and 2, a system for adjusting the alignment or orientation and position of a feed arm 200 associated with the wafer handling robot 200 (shown schematically in FIG. 10) of a semiconductor tool includes an alignment apparatus 100 for use in pre-adjusting the movement of the feed arm during initial equipment setup. Alignment apparatus 100 includes an alignment base 102 which is configured and dimensioned for removable and temporary insertion into wafer slots 16 of FOUP 10 similarly to a wafer (see directional arrows in FIG. 1). Alignment base has an axial centerline CL which is concentrically aligned and coincides with the Y-axis and centerline of FOUP 10. This ensures that the centerlines of the base 102 and FOUP match to facilitate alignment of the robotic arm as further described herein.

Referring to FIGS. 1 and 2, the base 102 comprises a generally flat body including a front end 106, a rear end 108, and opposing lateral sides 110. Front end 106 may be rounded similarly to a wafer to complement inwardly curved shape wafer slots 16 in some embodiments as shown in FIG. 1. Various embodiments of alignment base 102 further include one or more open areas or cutouts 104. In the embodiment shown in FIGS. 1 and 2, two cutouts 104 that are hemispherical in shape and spaced apart are provided forming a central bridge portion 101 which may be used for mounting alignment devices as further described herein. Bridge portion 101 has a length that is longitudinally aligned with the Y-axis of FOUP 10 and centerline of base 102, and a lateral width (measured along the X-axis) sufficient for mounting alignment devices.

The pair of hemispherical cutouts 104 form two halves of parts a broken circle (see FIG. 2) that define a reference center C (see FIG. 4) for alignment base 102. Center C coincides in spatial relation and position with the geometric center of the circular wafer when present and fully seated in the FOUP slots 16 to facilitate accurate pre-alignment of the robotic feed arm with the anticipated position of the wafer during normal operation of the semiconductor processing tool and robot.

The X-Y-Z reference coordinate system may be superimposed onto the alignment base 102 with the origin at a reference center C of the base for convenience of reference. It should be noted that center C is not necessarily the physical or geometric center of alignment base 102, but rather a reference center or origin for conducting alignment and positioning adjustments to feed arm 200 of robot 202.

Figure 3:
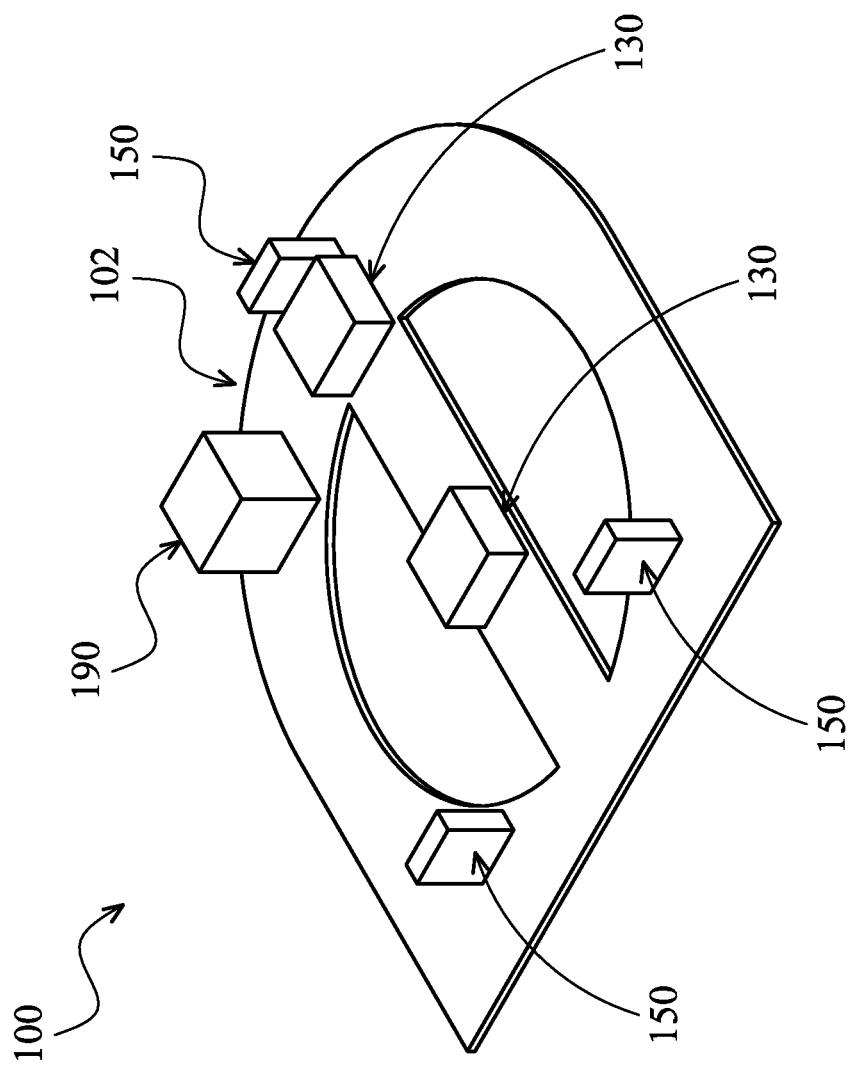
FIG. 3 is a perspective view of an alternative embodiment of an alignment apparatus.

Alignment apparatus 100 further includes at least one electronic full array digital image sensor 130, and in some embodiments at least one distance detection device 150 as shown in FIGS. 2 and 3. These figures show two possible arrangements and configurations of digital image sensor(s) 130 and distance detection device(s) 150 on alignment apparatus 100. As shown, one or more digital image sensor(s) 130 and distance detection device(s) 150 are mounted on alignment base 102.

Digital image sensor 130 is a pixilated full array image capture sensor such as a charge coupled device (CCD) or complementary metal oxide semiconductor (CMOS) camera in some embodiments that is operable to electronically capture a digital visual image of a physical object through an optical lens associated with the digital image sensor. Digital image sensor 130 is further operable to transmit a signal containing that captured image in real time to a graphic display screen on a video display device such as video display monitor 142 (see, e.g. FIG. 6), which in some embodiments without limitation may be an LCD or LED monitor. In one embodiment, digital image sensor 130 is a CCD camera.

Referring to FIGS. 2-5, in embodiments having a single digital image sensor 130, the digital image sensor is mounted at the center C of alignment base 102 and includes an optical lens 132 for capturing an image. In one embodiment, digital image sensor 130 is mounted on bridge portion 101 of the base. Lens 132 may have a fixed or automatically adjustable and variable focal length to capture a sharp image. Lens 132 is positioned precisely at and concentrically aligned with center C of alignment base 102 and faces in a downwards pointing through an axially aligned aperture 134 formed in base 102 (see FIGS. 4 and 5) beneath digital image sensor 130 to capture an image below the base. The digital image sensor 130 is positioned so that the sensor and particularly lens 132 are axially aligned with the Y-axis, and in some embodiments with the X-axis as shown thereby placing the lens at the intersection of the X and Y axes.

In embodiments having a second digital image sensor 130, the additional digital image sensor is mounted and positioned on alignment base 102 proximate to the front end 106 of the base as best shown in FIGS. 2 and 3. In one embodiment, the second digital image sensor 130 is mounted on bridge portion 101 of the base. The second digital image sensor 130 may be configured similarly to the first digital image sensor 130 mounted at the center C of the alignment base, and includes a lens 132 oriented and positioned the same. An aperture 134 is similarly formed in base 102 beneath the second digital image sensor 130 and axially aligned with lens 132 for capturing an image below the base. In one embodiment, the second digital image sensor 130 is positioned so that the sensor and particular lens 132 are axially aligned with the Y-axis; however, lens 132 is spaced apart from and not aligned with the X-axis as shown. Accordingly, the second digital image sensor 130 is spaced apart from the first digital image sensor 130 by a distance along the Y-axis as shown.

Digital image sensor 130 is operable to capture and display a continuously running video image in real time similar in operation to a monitoring or surveillance camera, for reasons which will become apparent.

Referring to FIGS. 1-4, distance detection device 150 mounted on alignment base 102 is operable to measure distance to a physical object from the device. Any type of commercially-available distance detection device with suitable range that is capable of being mounted on alignment base 102 may be used including electronic non-contact and physical contact type distance measuring devices. In one embodiment, a suitable non-contact device usable for distance detection device 150 is an ultrasonic transceiver or sensor, which is well known to those skilled in the art. These units are operable to generate and transmit high frequency sound waves at a target object and evaluate the echo which is reflected by the target and received back by the sensor. The sensor calculates the time interval between sending the signal and receiving the echo to determine a distance to a target object.

Another suitable non-contact distance detection device 150 is a laser rangefinder which generates a narrow pulsed laser beam that strikes a target object and measures the time for the beam to be reflected back to the device. Yet another suitable non-contact distance detection device that may be used is an infrared (IR) distance sensor which is known in the art.

The foregoing electronic non-contact type distance detection devices 150 are mountable at any suitable locations on alignment base 102 so long at they are operable to measure a vertical distance along the Z-axis from the device to a point below the alignment base as further described herein. FIGS. 2 and 3 show two possible mounting arrangements for distance detection devices. In FIG. 2, each distance detection device 150 is located adjacent to the two hemispherical cutouts 104 so that a portion of each device overhangs the cutout openings. This gives the distance detection devices 150 an unobstructed view below alignment base 102 for distance measurement. In FIG. 3, each distance detection device 150 is located and mounted on a solid area of alignment base 102 as opposed to an open area such as cutouts 104. In this mounting scenario, a through hole 152 is provided for each distance detection device 150 beneath the device to provide an unobstructed view below alignment base 102. Either mounting scenario or a combination of the mounting arrangements shown in FIGS. 2 and 3 may be used.

Figure 16:
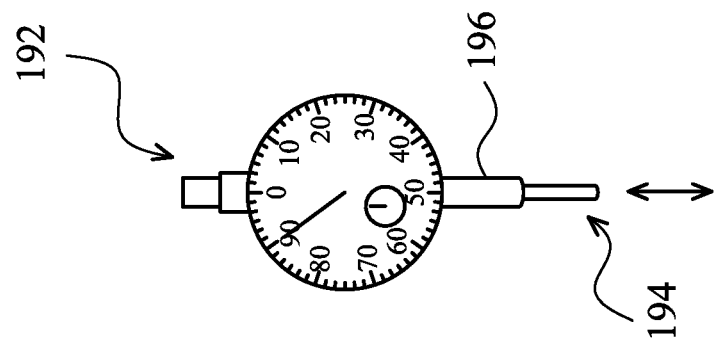
FIG. 16 is a front elevation view of the plunger depth gauge of FIGS. 14 and 15.
Figure 15:
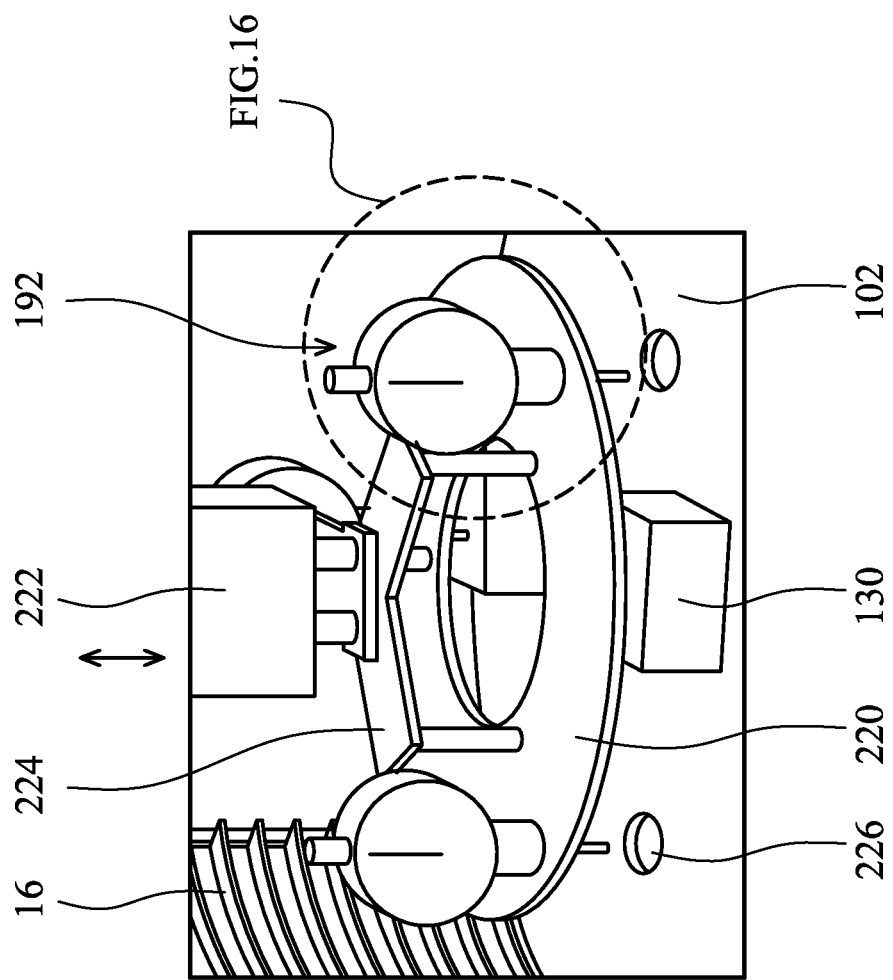
FIG. 15 is an enlarged partial perspective view thereof showing components in greater detail including the plunger depth gauges.
Figure 17:
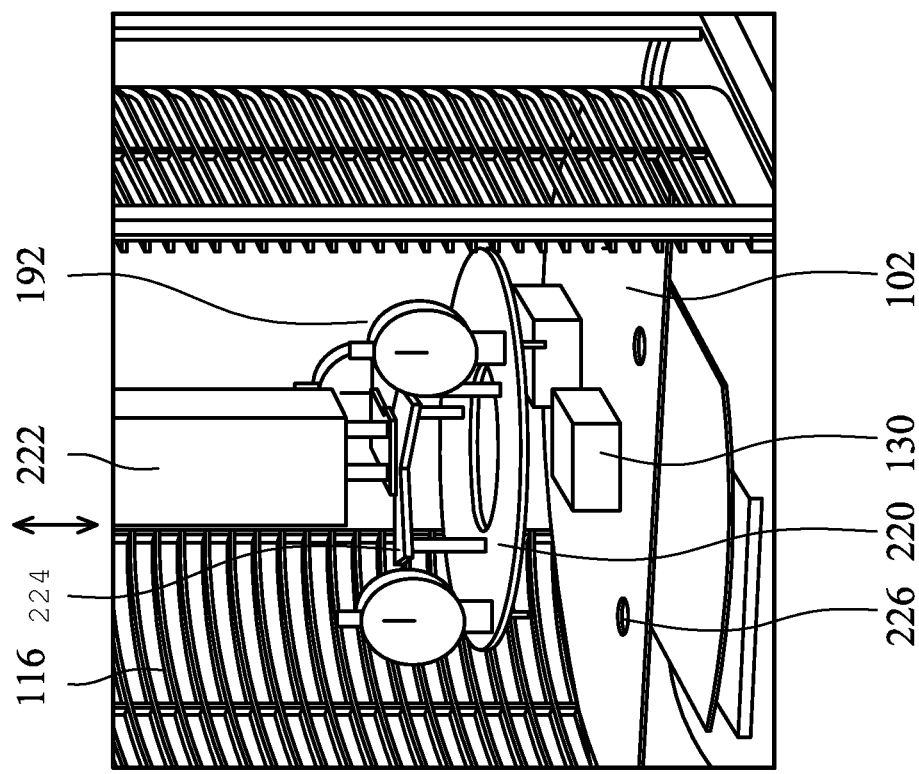
FIG. 17 is a partial perspective view of the wafer carrier showing the plunger depth gauge assembly in a first raised position.

Suitable physical contact-type distance measuring devices that are usable for distance detection device 150 include commercially-available plunger depth gauges 192 that are mountable on alignment base 102 (see, e.g. FIG. 16). These gauges have variably retractable plungers 194 which operate to measure a distance from the gauge. The plunger 194 is spring-loaded and retracts into body 196 of the plunger when the plunger comes into physical contact with an object and converts the amount of retraction into a measured distance which is displayed. Digital readout or dial type plunger gauges may be used. The digital readout type plunger gauges have an on-board battery operated power supply for operation and display of the measured distance. This arrangement will be further described herein.

A suitable electric power supply 190 is mounted on alignment base 102 as shown in FIG. 3 for powering digital image sensor(s) 130 and distance detection device(s) 150. In some embodiments, the power supply 190 may be battery-operated or provide power via connection to a suitable DC voltage source. Electric wire leads (not shown) are routed along base 102 to the digital image sensor(s) and distance detection device(s) 150.

The positioning system for adjusting the alignment and position of a semiconductor wafer handling robot feed arm 200 according to the present disclosure further includes a positioning plate 170 as shown for example in FIGS. 5, 8, 10, and 11. Position plate 170 is flat and has a generally rectangular configuration in one embodiment as shown. The plate 170 is configured for detachable mounting to the robotic feed arm 200 for performing pre-operational robot spatial alignment adjustments to properly locate, pick, and replace wafers from the FOUP 10 (see FIG. 1). The position plate may be made of any appropriate material suitable for an alignment reference device including without limitation plastic or metal of sufficient thickness to resistant warping and remain relatively flat.

To assist with properly aligning the robotic feed arm 200, the positioning plate 170 includes visual or graphic alignment marks or indicia 172 for judging the relative position and orientation of the feed arm with respect to the alignment base 102 and hence wafers slots 16 of wafer carrier 10. The alignment indicia 172 may be marked, painted, stamped, applied, molded into, etched, or otherwise marked or formed on reference position plate 170. The method used does not matter so long as the indicia are visible.

Figure 11:
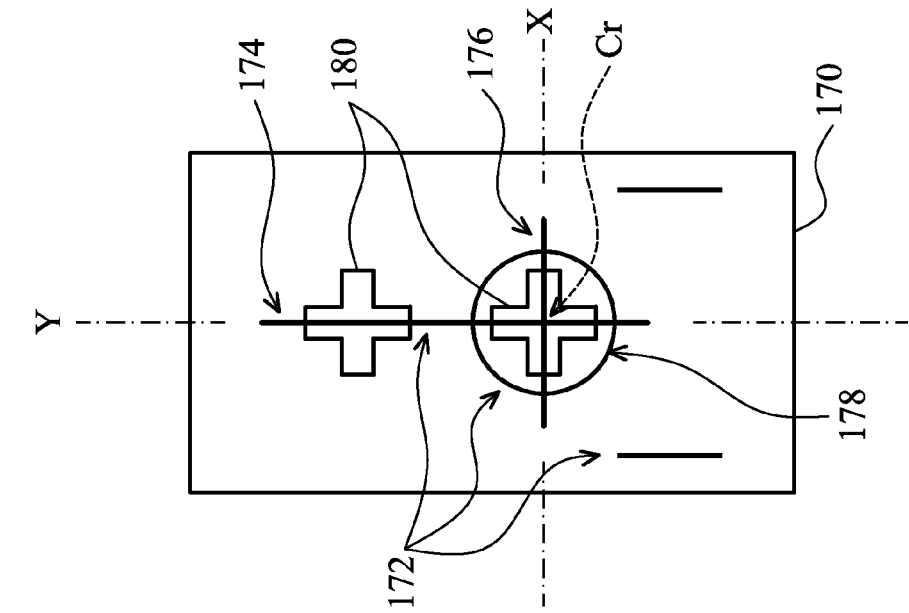
FIG. 11 is a second screen shot from a video display monitor showing a reference mark superimposed over an image of alignment indicia on the positioning plate captured by digital image sensor, with the alignment indicia being shown properly positioned and aligned with the reference mark.
Figure 10:
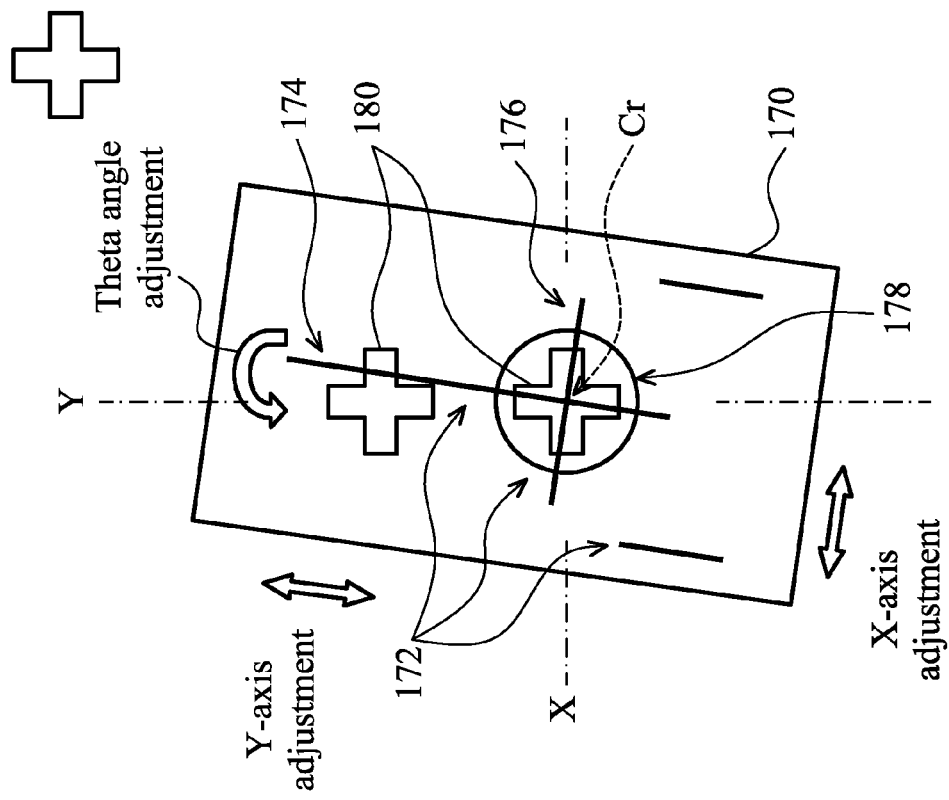
FIG. 10 is a first screen shot from a video display monitor showing a reference mark superimposed over an image of alignment indicia on the positioning plate captured by digital image sensor, with the alignment indicia being shown out of alignment and position with the reference mark.

In one embodiment, as best shown in FIGS. 10 and 11, the alignment indicia 172 includes a combination of lines and/or other geometric shapes of suitable configuration sufficient to allow adjustment of the positioning plate 170 with respect to the X-axis, Y-axis, and angle Theta (θ) orientation via adjustment of the robotic feed arm 200. In this embodiment, the alignment indicia 172 includes at least one cruciform marking in the form of a cross-hair 178 created the intersection of two perpendicular-oriented straight reference lines 174, 176 (i.e. one line 174 oriented longitudinally along the length of the plate 170 and another line 176 oriented transversely across the width of the plate). Line 174 is positioned midway between the lateral sides of positioning plate 170 in the embodiment shown. These reference lines 174, 176 intersect at a 90 degree angle to each other at a point defining a reference center Cr on positioning plate 170. The cross-hair 178 is located on positioning plate 170 so that the center Cr is located to match and coincide with (to the greatest extent practicable) the location of the geometric center of a wafer when positioned on the robotic feed arm 200 during normal operation of the semiconductor processing tool. Accordingly, the alignment indicia 172 of positioning plate 170 mimics and acts as a positional surrogate for the wafer during pre-operational alignment adjustments of robot 202. The longitudinally and transversely oriented reference lines of the cross-hair 178 will be used to compare, judge, and adjust the X and Y position and angular orientation (angle Theta) of the positioning plate 170 with respect to the X-axis and Y-axis reference coordinate system defined by alignment base 102, as further described herein.

The alignment indicia 172 on positioning plate 170 are used in conjunction with the digital image sensor(s) 130 describe herein for adjusting the position of the plate and robotic feed arm 200. Accordingly, in embodiments where a single centrally located digital image sensor 130 is provided on alignment base 102, the foregoing cross-hair 178 formed by alignment indicia 172 should be located on plate 170 to become vertically aligned with the digital image sensor within the FOUP 10 so that the cross-hair 178 is within visual sight of the sensor lens. The single digital image sensor 130 and cross-hair 178 will be used to judge and make X-axis, Y-axis, and angle Theta adjustments to the position of robotic feed arm 200.

In embodiments where two spaced apart digital image sensors 130 are provided as shown in FIGS. 2 and 3, longitudinal reference line 174 may be extended towards the front end of positioning plate 170 (see, e.g. FIGS. 10 and 11) so that this forward portion of line 174 is within visual sight of the second sensor lens. In this embodiment, the centrally located digital image sensor 130 will be used to judge and make X-axis and Y-axis adjustments to the position of robotic feed arm 200. The digital image sensor 130 located proximate to the front end 106 of alignment base 102 will be used to judge and make angle Theta adjustments to the angular position and orientation of robotic feed arm 200. This arrangement is advantageous and more accurate since the lateral position of reference line 174 with respect to the Y-axis can be judged more precisely by observing two points (i.e. one at each digital image sensor 130) along the line 174.

Referring to FIGS. 4, 5, 10, and 11, each digital image sensor 130 has an associated transparent marker substrate 182 which includes a target reference mark 180 for alignment with alignment indicia 172 on positioning plate 170 during initial setup and adjustment of the robotic feed arm 200. The reference mark 180 corresponds to a desired alignment and position of the alignment indicia 172 on positioning plate 170 in the horizontal X-Y plane with respect to the alignment base. An image of the reference mark 180 is captured by digital image sensor 130 and overlaid on video display monitor 142 (see, e.g. FIGS. 5 and 6) for comparison to an image also captured of the alignment indicia 172. In alternative embodiments contemplated, the digital image sensor 130 may electronically generate and display a reference mark 180 on the screen of video display monitor 142 in a manner similar to how a digital camera may electronically produce an aiming or sighting target mark or line on its on-board display.

In one embodiment, with continuing reference to FIGS. 4, 5, 10, and 11, the marker substrate 182 may be made of glass or a suitable transparent plastic. Marker substrate 182 is mounted on a bottom surface of alignment base 102 below aperture 134 formed in base 102 beneath digital image sensor (s) 130 so that the reference mark 180 is visible through the aperture to the sensor lens 132. Marker substrate 182 may be affixed to alignment base 102 by any suitable means including adhesives in one embodiment.

The reference mark 180 may be marked, painted, stamped, applied, embedded, molded into, etched, or otherwise marked or formed on substrate 182. The method used does not matter so long as the mark is visible to the digital image sensor 130. In one embodiment, reference mark 180 may be located proximate to or on a bottom surface of the substrate 182. Marker substrate 182 may have any suitable thickness and configuration. In one embodiment, as shown, substrate 182 may be circular. Other suitable configurations including rectilinear or polygonal shapes may be used.

Figure 4:
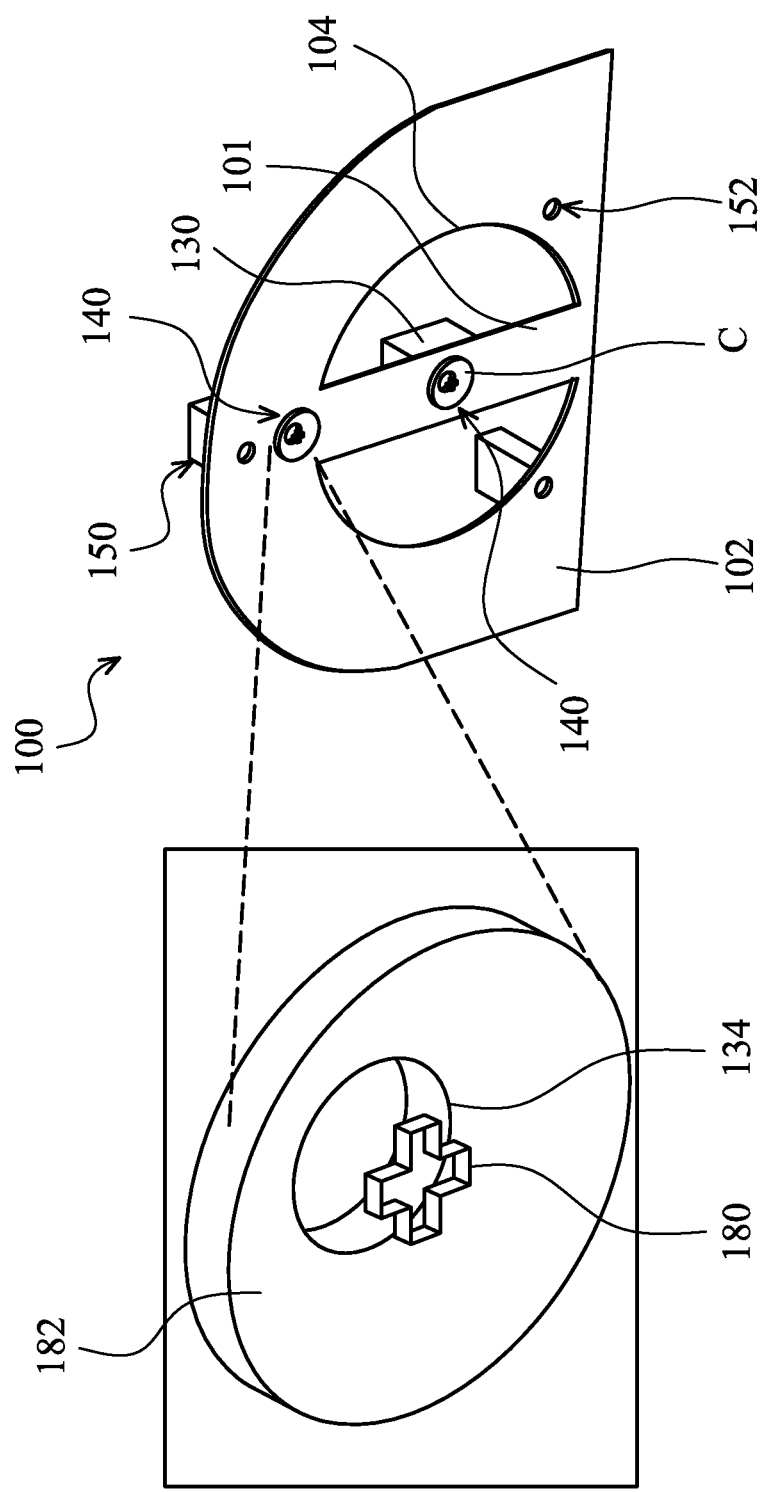
FIG. 4 is bottom perspective view thereof including a close-up detail of a portion of the alignment apparatus.

In one embodiment, with reference to FIGS. 4, 10, and 11, reference mark 180 may have an open cruciform or cross shape as shown which complements the shape of the cross-hair 178 of the alignment indicia 172 on positioning plate 170 which will be positioned below alignment base 102 in FOUP 10 during the robotic feed arm 200 alignment procedure. Reference mark 180 represents the ideal desired or intended proper spatial position and orientation of a wafer in slots 16 of FOUP 10 with respect to the X and Y axis to avoid damage to the wafer by the feed arm 200. The reference mark 180 will therefore be used as a benchmark for aligning the position and orientation of the wafer surrogate positioning plate 170 in slots 16 of FOUP 10 during the initial robot setup. As further described herein, this will be accomplished in one embodiment by comparing the position and orientation of the cross-hair 178 indicia on positioning plate 170 with mark 180.

Figure 6:
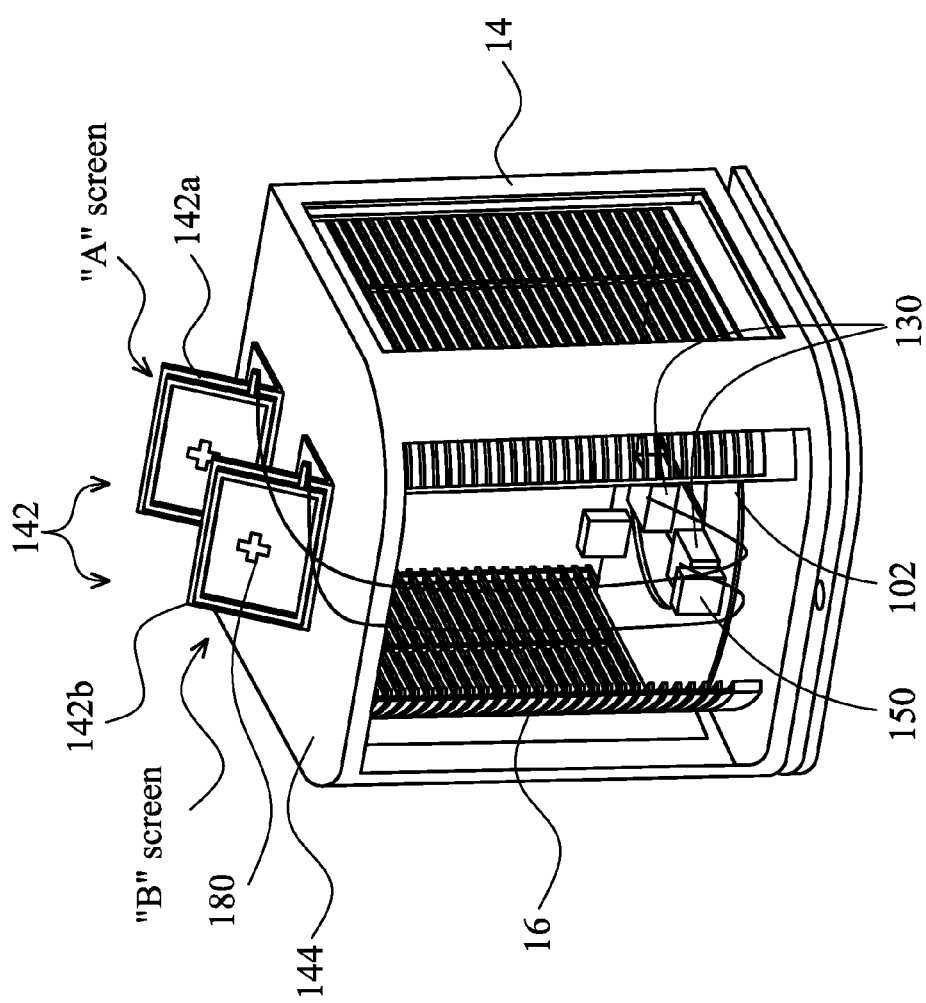
FIG. 6 is a perspective view of an alignment apparatus positioned in the wafer carrier with video display monitors associated with the positioning system.

In FIGS. 10 and 11, in some embodiments, it should be noted that the lower reference mark 180 would appear on the "A" screen as shown in FIG. 6 on monitor 142a and the upper reference mark 180 would appear on the "B" screen on monitor 142b. They are shown together in these figures for convenience of description.

An exemplary method for adjusting the position and alignment of a semiconductor tool wafer handling robot feed arm will now be described with primary reference to the flowchart in FIG. 12 which describes the basic method steps. The method to be presently described utilizes a basic alignment apparatus 100 as shown in FIGS. 1-5, but having only a single digital image sensor 130 mounted on alignment base 102 at the center C of the base at the intersection of the X and Y axes. In this embodiment, the digital image sensor is a CCD camera. At least one or more digital non-contact distance detection devices 150 are mounted on base 102 at suitable locations.

Figure 5:
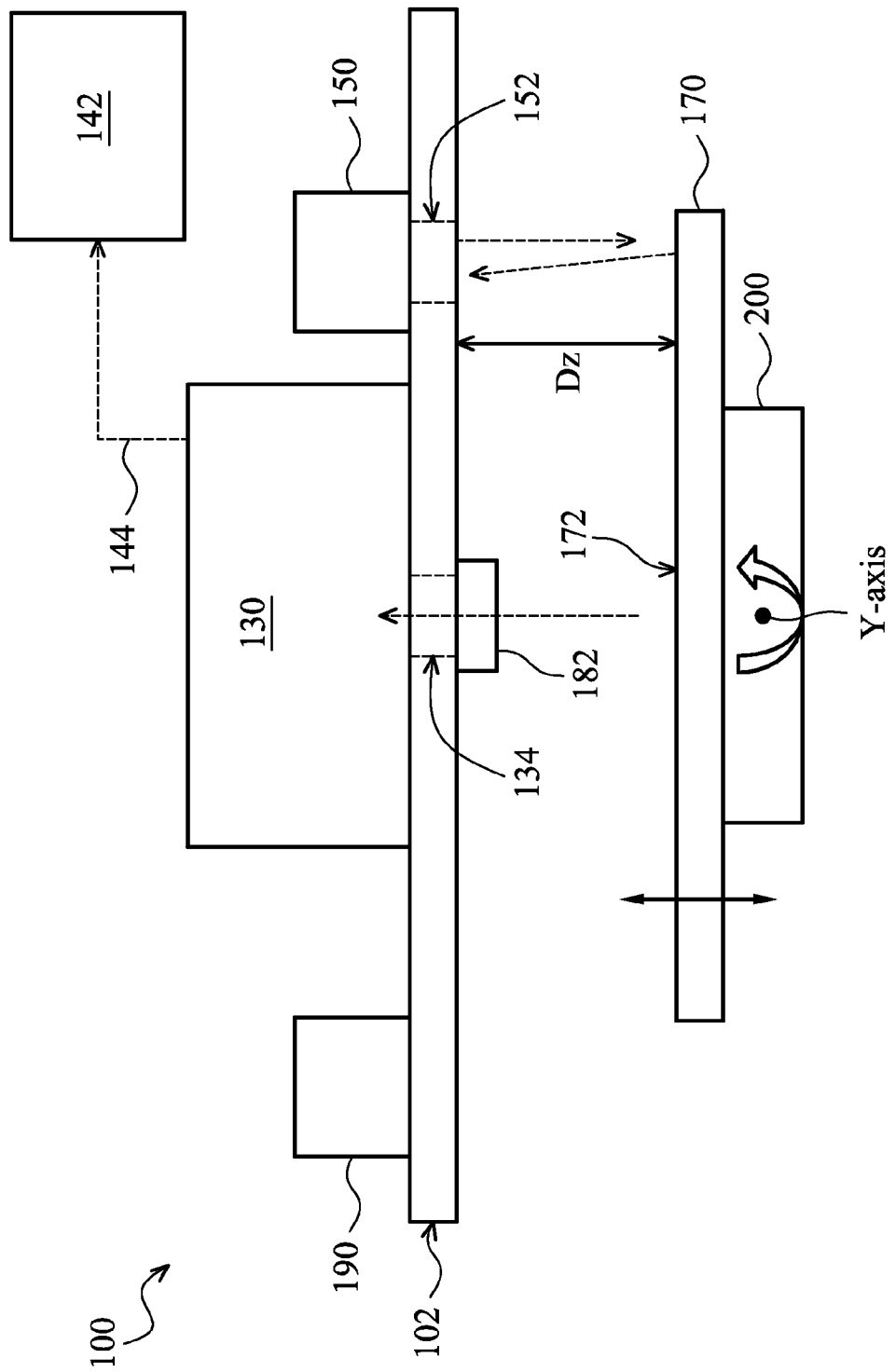
FIG. 5 is a side or elevation view of an alignment and positioning system for a robotic feed arm according to the present disclosure including an alignment apparatus.

The method begins with an initial positioning or alignment system setup by first sliding alignment base 102 into one of the wafer slots 16 into FOUP 10 as shown in FIG. 1. A signal output line 144 is connected from the digital image sensor 130 to a video display monitor such as monitor 142a as shown in FIGS. 5 and 6 which has a display screen for displaying a video image captured by the digital image sensor (note that an additional monitor 142a is shown, which will be used in conjunction with description of the method shown in the flowchart of FIG. 13 later). The wafer handling robot alignment system as shown in FIG. 6 is now ready to begin the alignment process shown in the flowchart of FIG. 12.

Figure 7:
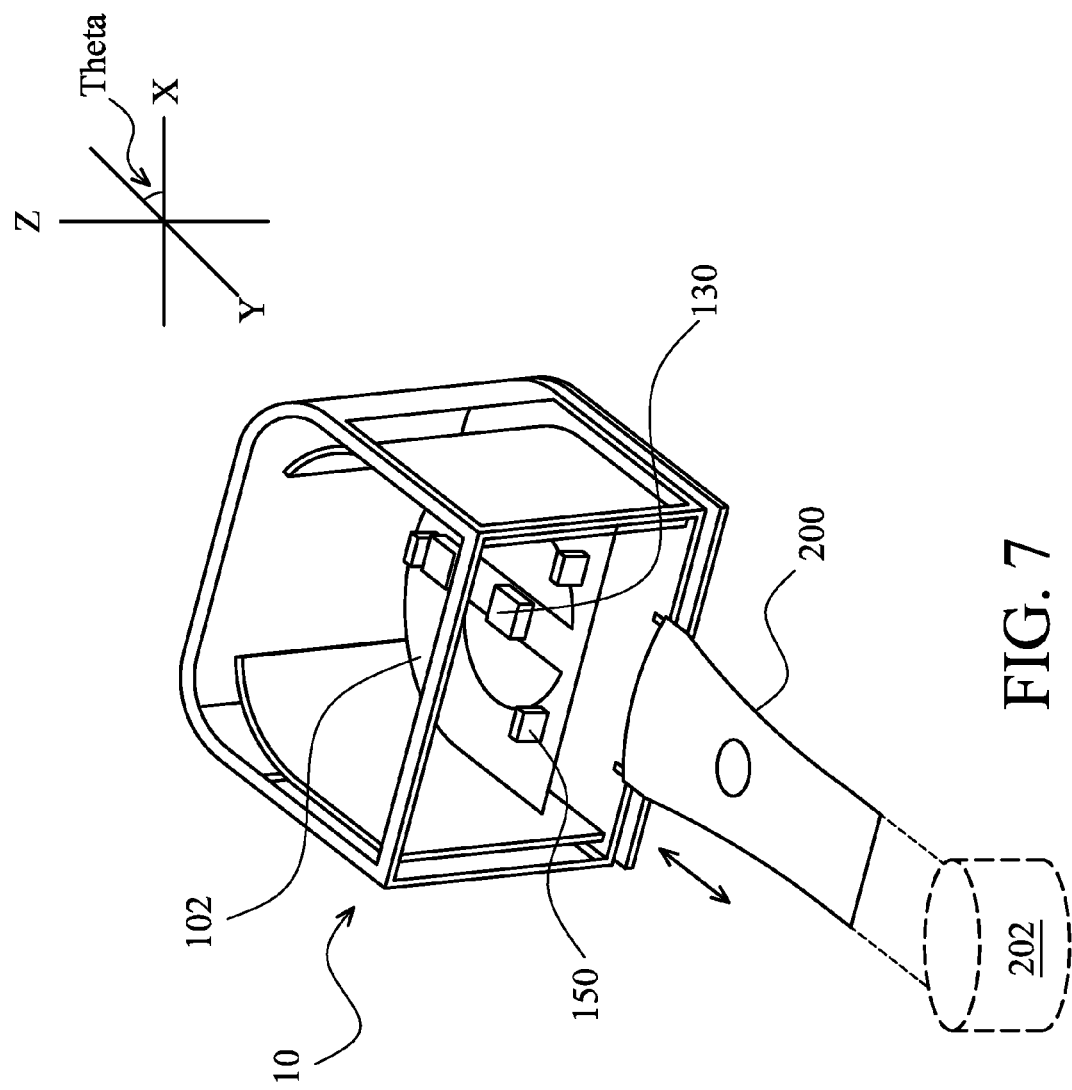
FIG. 7 is a perspective view of a wafer carrier with alignment apparatus positioned therein, and a wafer handling robot with feed arm insertable into the carrier.
Figure 12:
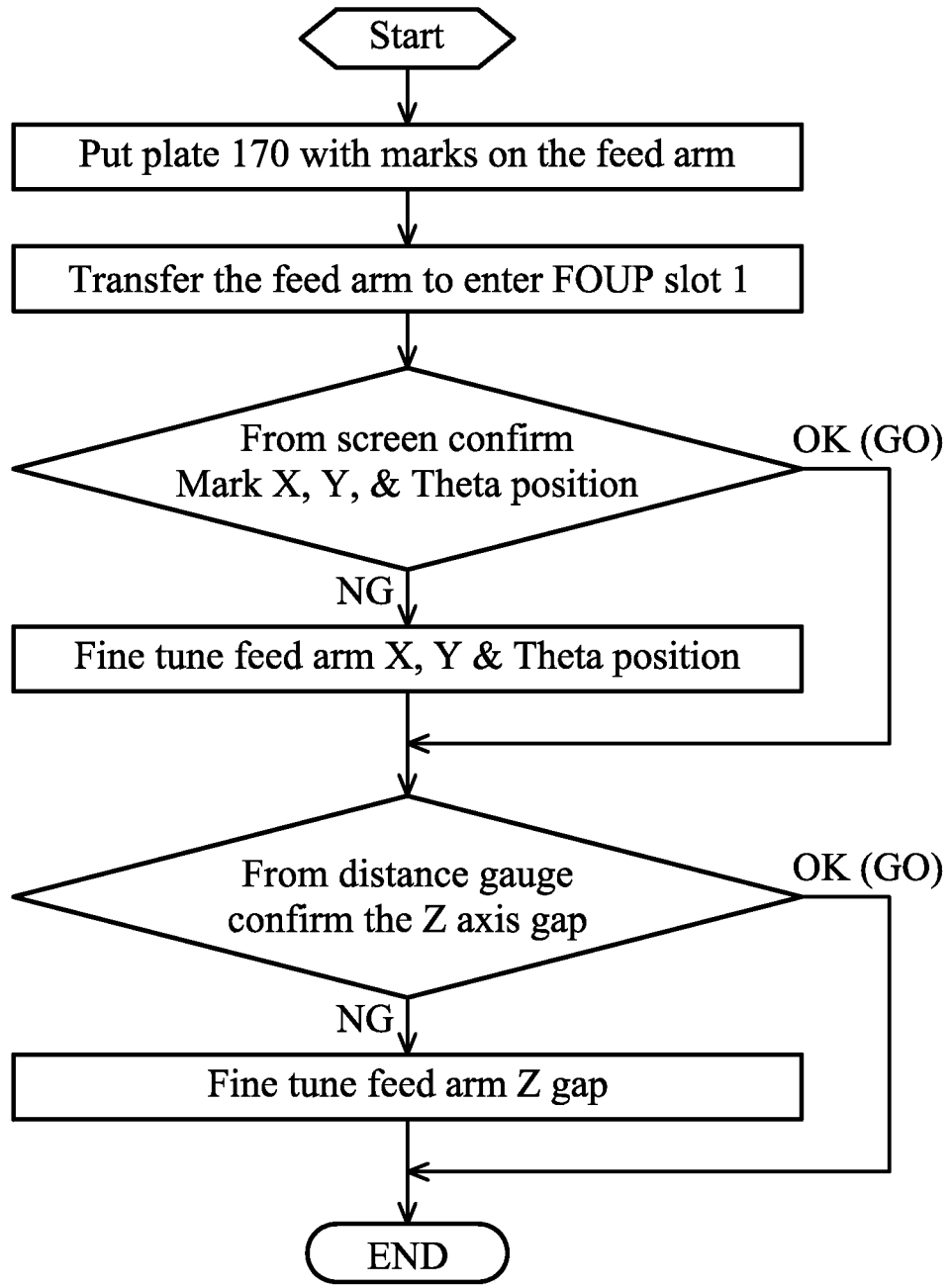
FIG. 12 is a flowchart showing a first exemplary method for adjusting the alignment and position of a feed arm associated with a wafer handling robot using an alignment apparatus of FIGS. 1-9.

Referring to FIG. 12, FOUP 10, which is already setup with installed alignment base 102 and monitor 142a as shown in FIG. 6 and described above, is then placed on a semiconductor wafer fabrication tool loadport (not shown) in a normal wafer loading/unloading position; the arrangement being well known by those skilled in the art without further description. This places the FOUP 10 with alignment apparatus 100 within reach of the feed arm 200 of wafer handling robot 202 as shown in FIG. 7. The feed arm 200 is operable to extend into and retract from FOUP in forward and backward directions (i.e. "reach") along the Y-axis to place and retrieve wafers from slots 16, pivot or turn laterally sideways in a horizontal plane with respect to and defined by the X and Y axes (i.e. Theta movement), and move up or down vertically along the Z-axis in a usual manner. Wafer transfer or handling robots are commercially available from numerous companies, such as Kawasaki Heavy Industries, Ltd. of Tokyo, Japan.

Figure 8:
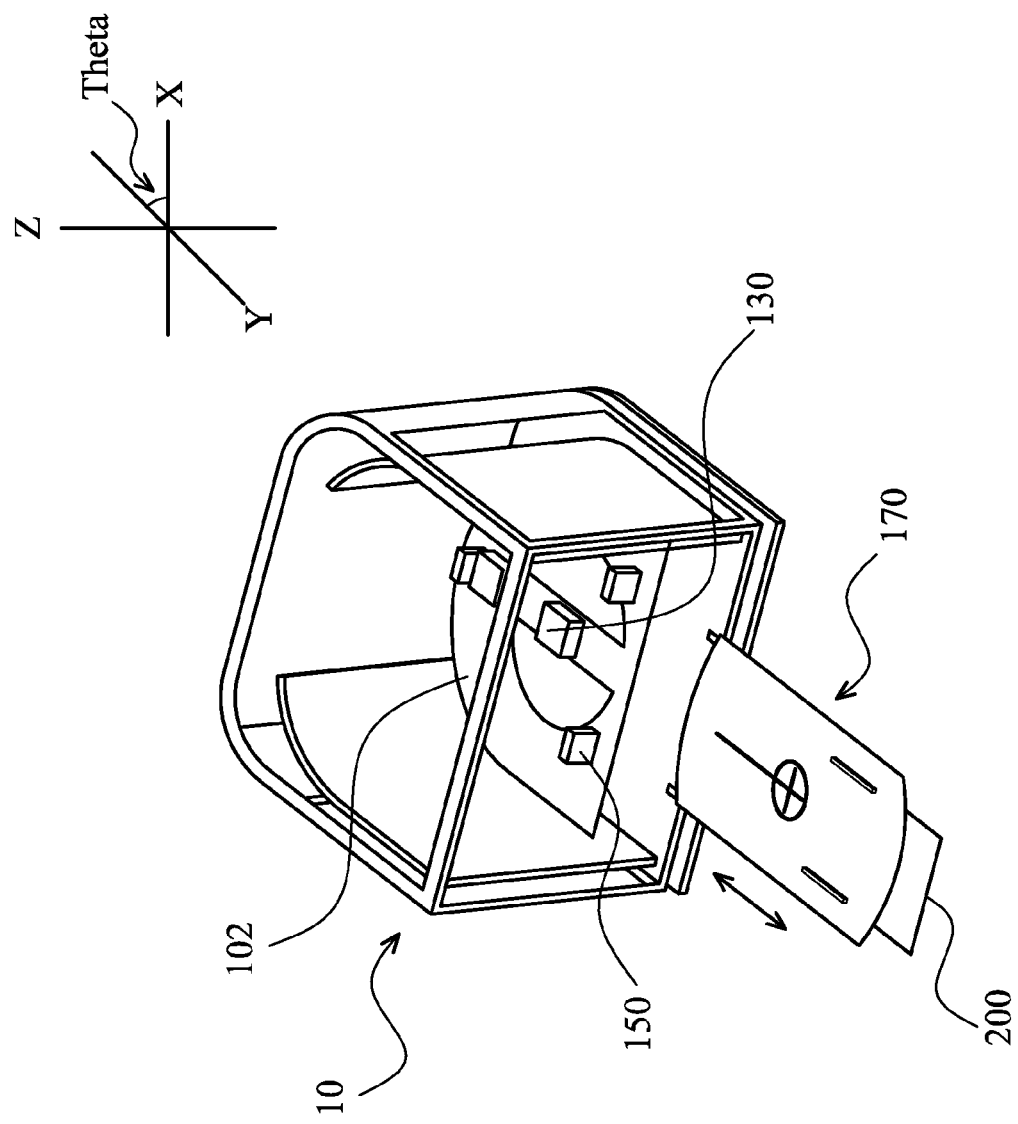
FIG. 8 is a perspective view thereof with a positioning plate having alignment indicia mounted on the feed arm.
Figure 9:
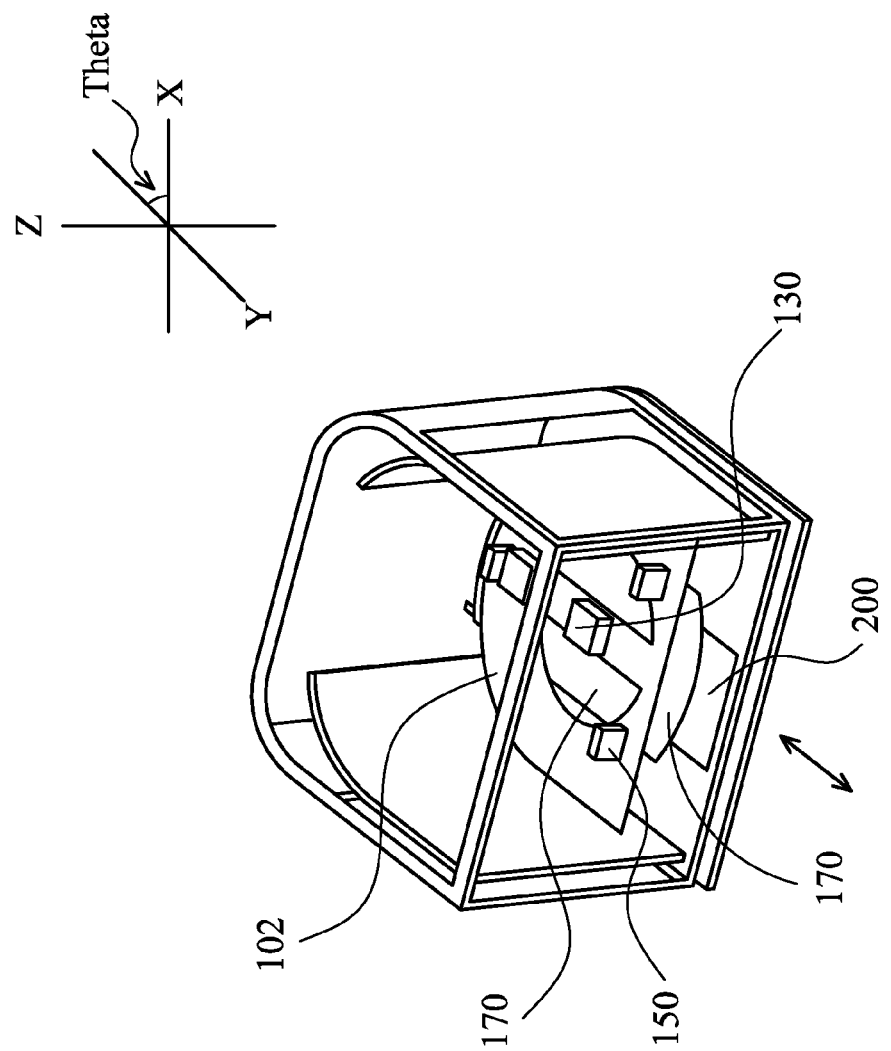
FIG. 9 is a perspective view thereof with the robotic feed arm with positioning plate thereon positioned in the wafer carrier for alignment and positioning analysis and adjustments.

Next, the positioning plate 170 with alignment indicia 172 is temporarily and removably placed or mounted onto feed arm 200 with the orientation as shown in FIG. 8. Reference line 174 (best shown in FIGS. 10 and 11) is axially aligned with the Y-axis. Next, the positioning plate 170 is then transferred into one of the wafer slots 16 of FOUP 10 by inserting the feed arm 200 forwards into the FOUP as shown in FIG. 9. The positioning plate 170 is inserted into a vacant slot below the alignment base 102 in FOUP 10 as shown if FIGS. 5 and 9. Accordingly, positioning plate 170 is in view of the digital image sensor 130 and distance detection device 150 as shown in FIG. 5. The cross-hair 178 on positioning plate 170 is vertically aligned with digital image sensor 130. At least a portion of positioning plate 170 is vertically aligned with distance detection device 150 so that the distance may be measured from the alignment base 102 to the positioning plate 170 which acts as a surrogate for a wafer with respect to position in FOUP 10.

The robotic feed arm 200 positioning and alignment process is now ready to proceed for making adjustments to the position and alignment of the feed arm 202 in FOUP 10 vis-à-vis the positioning plate 170.

With digital image sensor 130 being activated, a real time visual video image of positioning plate 170 and alignment indicia 172 is captured by sensor and displayed on the screen of monitor 142a (see also FIG. 6). In one embodiment, a continuously running digital video image is displayed. The cruciform reference mark 180 on marker substrate 182 is displayed as well and overlaid onto the image of the alignment indicia 172 on the monitor screen as best shown in FIGS. 10 and 11. The cross-hair 178 and cruciform shape are therefore superimposed on the monitor 142a display screen for comparison of their relative positions in aligning the robotic feed arm 200. The cruciform reference mark 180 remains stationary in position on monitor 142a, whereas the cross-hair 178 will appear movable on the screen corresponding to the movement of positioning plate 170 by the feed arm 200.

With continuing reference to FIG. 12, the displayed screen image on monitor 142a is analyzed (e.g. by an operator or technician) for comparing the X-axis, Y-axis, and Theta position and alignment of the cross-hair 178 of the alignment indicia 172 with the cruciform reference mark 180, which in one embodiment may appear as shown in FIG. 10. A decision is then made to determine if the alignment and position of the cross-hair 178 with respect to the cruciform mark 180 is acceptable (a "GO" or "OK" conclusion or response). It should be remembered that the positioning plate 170 represents a method for actually judging the acceptable position and alignment of the robotic feed arm 200 with respect to a position in slot 16 of FOUP 10 that will avoid damage to a wafer when inserted into or retrieved from the FOUP.

In FIG. 10, the position of the feed arm is not acceptable (a "NO GO" conclusion or response) in the decision block shown in FIG. 12 for checking the X-axis, Y-axis, and Theta position. The center Cr of the cross-hair 178 is not centered in cruciform mark 180, thereby indicating the robotic feed arm 200 is not centered in the slot 16 of FOUP 10. The cross-hair 178 position also appears misaligned with the X-axis and Y-axis. Furthermore, the cross-hair 178 appears twisted at an angle to X-axis and Y-axis indicating that the Theta position is off for robotic feed arm 200 alignment as well.

To rectify the misalignment shown in FIG. 10, fine tuning adjustments as indicated in FIG. 12 are made to robot 202 to adjust and realign the position of feed arm 200 until the X-axis, Y-axis, and Theta position are acceptable as shown in FIG. 11. The feed arm 200 position shown is now acceptable and would be unlikely to damage a wafer during insertion and removal operations from FOUP 10 with respect to the proper horizontal positioning of the feed arm related to the plane defined by the X-axis and Y-axis.

With continuing reference to the flowchart of FIG. 12, the proper vertical position of robotic feed arm 200 with respect to the Z-axis is next determined in the decision block shown. With the distance detection device 150 activated, the vertical distance Dz is measured between the positioning plate 170 and alignment base 102 as shown in FIG. 5. The measured distance is displayed either locally on the distance detection device or remotely on a monitor such as monitor 142a or another output display by a suitable signal interconnection. The displayed distance Dz is compared to a predetermined benchmark or ideal Dz value associated with a proper Z-axis vertical position of feed arm 200 intended to avoid wafer damage during insertion and removal operations from FOUP 10.

A decision is then made (e.g. by an operator or technician) to determine if the vertical Z-axis position of positioning plate 170 is acceptable (a "GO" or "OK" conclusion or response). If yes, then the robotic arm positioning and alignment setup is complete, and the semiconductor tool is readied for normal operation. If the vertical Z-axis position is not acceptable, fine tuning adjustments as indicated in FIG. 12 are made to robot 202 to adjust the vertical Z-axis position of feed arm 200 until the measured distance Dz is at or within an acceptable predetermine range. The setup procedure is then completed.

During the foregoing setup procedure as shown in FIG. 12, it should be noted that the alignment base 102 remains stationary in FOUP 10 and adjustments are made by moving the robotic feed arm 200 with respect to the FOUP.

As shown in FIG. 5, it will further be appreciated that some robotic feed arms 200 allow adjustments to be made for an angle of twist with respect to the Y-axis to ensure that the feed arm and wafer thereon will be level with respect to the X-Y horizontal plane to the greatest extent possible so that the wafer is squarely inserted into or withdrawn from slots 16 of FOUP 10. This can be accomplished by providing at least two spaced apart digital distance detection devices 150 (see, e.g. FIGS. 2 and 3) for measuring the vertical distance Dz to the positioning plate 170 at two different points. A difference in the measured distances from each distance detection device would signify that the robotic feed arm 200 (vis-à-vis the positioning plate 170) is twisted and not level horizontally.

Based on the foregoing, the method for aligning and adjusting the position of the robotic feed arm 200 could therefore include additional steps beyond those shown in the flowchart of FIG. 12 to check the level of the feed arm such as: (1) comparing the vertical distances Dz along the Z-axis measured by each distance detection device 150 to determine if the differences in the values measured are within an acceptable range of deviation; and (2) fine tuning the angle of twist of the feed arm 200 with respect to the Y-axis until the differences are acceptable indicating that the feed arm is level in the horizontal X-Y plane. Any of the robotic feed arm 200 alignment and positioning procedures described herein can be modified to include these additional level confirmation and adjustment steps.

Numerous variations are possible to the exemplary method for adjusting the position and alignment of a semiconductor tool wafer handling robot feed arm shown in FIG. 12 and described above.

Figure 13:
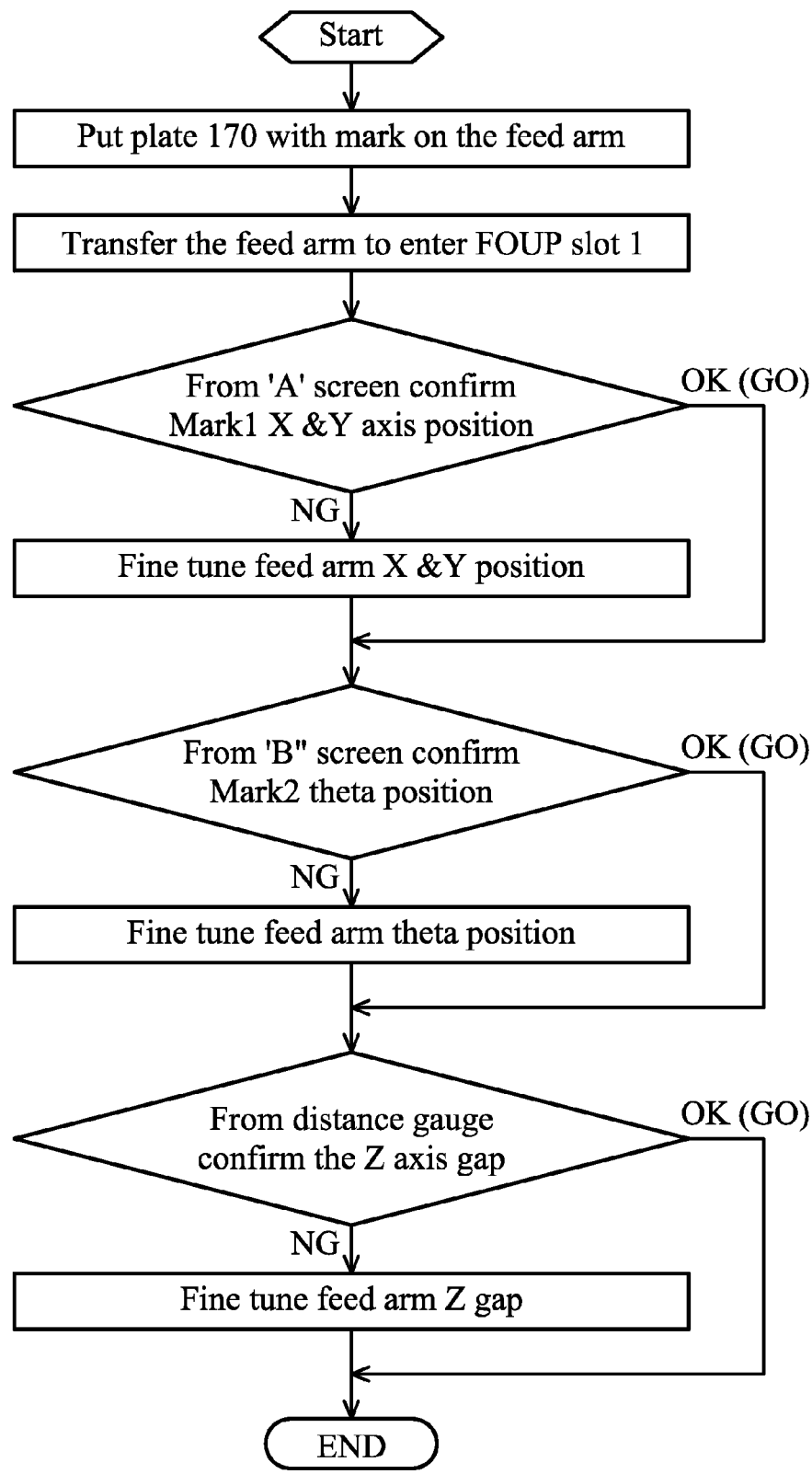
FIG. 13 is a flowchart showing a second exemplary method for adjusting the alignment and position of a feed arm associated with a wafer handling robot using an alignment apparatus of FIGS. 1-9.
Figure 14:
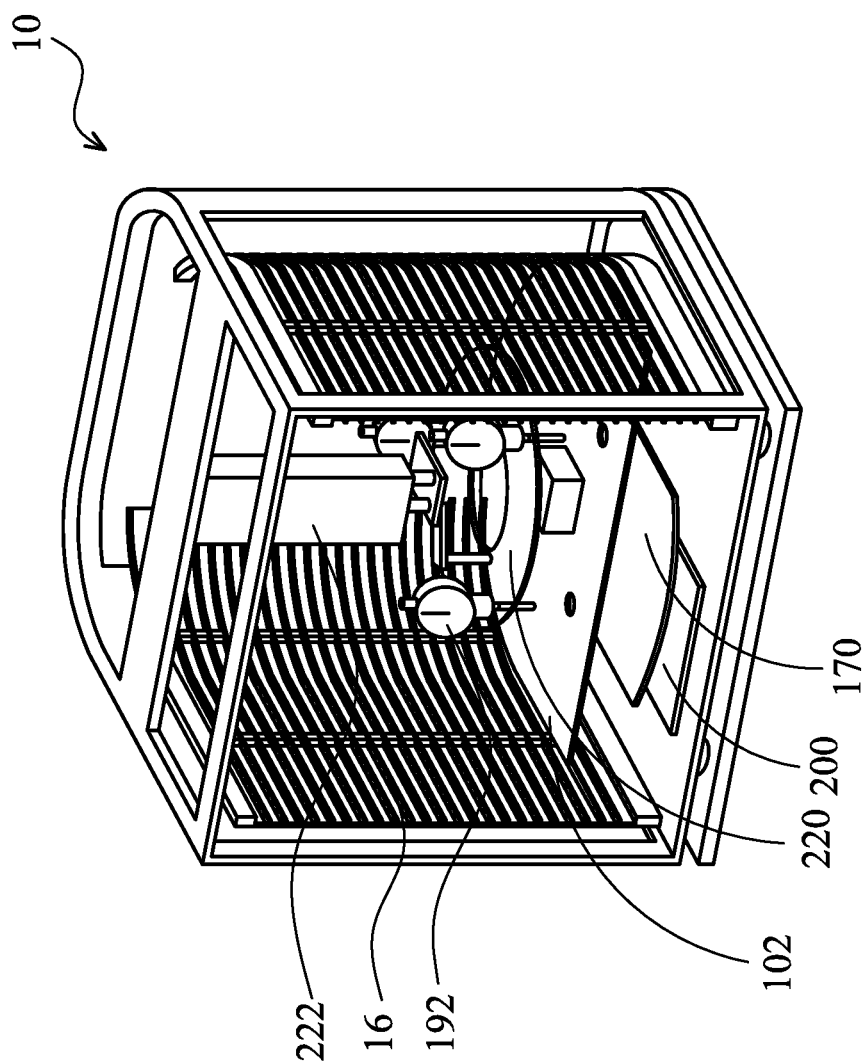
FIG. 14 is a perspective view of a wafer carrier with a second exemplary embodiment of an alignment apparatus and a vertically movable plunger depth gauge assembly according to the present disclosure disposed therein.

In another embodiment shown in the flowchart of FIG. 13, two spaced apart digital image sensors 130 are provided on alignment base 102 as shown in FIGS. 1-3. Each digital image sensor 130 is mounted on alignment base 102 along the Y-axis as shown. This arrangement advantageously provides greater accuracy in analyzing and adjusting the Theta position of the robotic feed arm 200 (vis-à-vis the positioning plate 170) since two spaced apart sections of reference line 174 on positioning plate 170 extending along the Y-axis are compared to the two cruciform marks 180 produced by the digital image sensors 130 as shown in FIGS. 10 and 11. Note in FIG. 10 that the deviation of line 174 from the forward most or top cruciform mark 180 is more pronounced and visible than at the lower or more centrally located cruciform mark 180.

To accomplish the method for adjusting the position and alignment of a semiconductor tool wafer handling robot feed arm using two digital image sensors 130, a second monitor 142b as shown in FIG. 6 may be added. The forward most or top cruciform mark 180 shown in FIGS. 10 and 11 would be used only for confirming the Theta position of reference line 174 ("Mark 2" in FIG. 13) on positioning plate 170 (displayed on the "B" screen noted in FIGS. 6 and 13). The lower or more centrally located cruciform mark 180 would be used for confirming the X and Y axis positions of the cross-hair 178 ("Mark 1" in FIG. 13) on positioning plate 170 (displayed on the "A" screen noted in FIGS. 6 and 13). As shown in the flowchart of FIG. 13, the Theta and X-Y comparisons and adjustments would be performed as two separate steps as noted in the flowchart. The procedural steps for the method in FIG. 13 would be essentially the same as in FIG. 12 and as already described herein except for the foregoing differences noted.

In lieu of digital distance detection devices 150, FIGS. 14-18 show an embodiment of a system for adjusting the alignment and position of a semiconductor tool wafer feed arm 200 using plunger depth gauges 192 for performing the vertical distance Dz measurements. For convenience of description in this embodiment, dial type depth gauges 192 are shown; however, digital readout depth gauges may alternative be provided.

Referring to FIGS. 14-18, plunger depth gauges 192 are mounted on a separate movable mounting ring 220 (also "probe ring") rigidly attached in turn to support frame 224 coupled to a piston mechanism 222 that is operable to raise and lower the mounting ring. Piston mechanism 222 may be motor driven or pneumatic. The support frame 224 may have any suitable configuration so long as the mounting ring 220 can be suspended from overhead and supported in a substantially level manner with respect to the X-Y horizontal plane from the piston mechanism 222. In order to allow the retractable plungers 194 to access positioning plate 170 beneath alignment base 102 for measurements, a through hole 226 is provided in base 102 beneath each depth gauge.

In the embodiment shown in FIGS. 14-18, three depth gauges 192 are provided; however, a single depth gauge may be used in other embodiments somewhat analogous to reasons for providing more than one distance detection devices 150 in other embodiments as already discussed above. In short, the addition of a second or more depth gauge allows the horizontal level of positioning plate 170 to be evaluated and adjusted.

Figure 18:
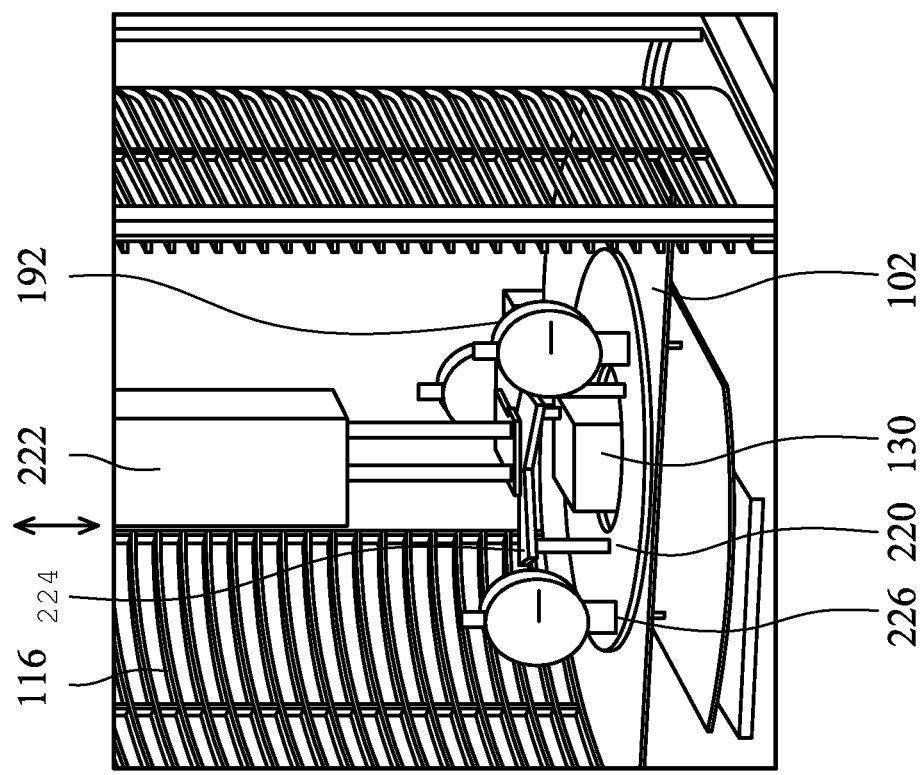
FIG. 18 is a partial perspective view of the wafer carrier showing the plunger depth gauge assembly in a second lowered position.

Mounting ring 220 is configured to allow the ring to be lowered into abutting contact with alignment base 102 as shown in FIG. 18. In one possible embodiment as shown, mounting ring 220 is annular shaped having a central opening that allows the centrally mounted digital image sensor 130 to pass through the ring when in a fully lowered position (see FIG. 18). Other suitable configuration or shapes of mounting ring 220 may be used including various rectilinear or polygonal shapes. Mounting ring may be made of any suitably stiff material that is resistant to deformation or warping to provide a flat level reference surface for conducting depth measurements (i.e. distance Dz). In one embodiment, ring 220 is made of metal such as without limitation stainless steel. Support frame 224 may similarly be constructed of metal such as stainless steel in some embodiments.

As shown in the figures, piston mechanism 222 operates to vertically move mounting ring 220 with depth gauges 192 from an upper stowed position (see FIG. 17) to an active lower measurement position (see FIG. 18). In operation, to measure distance Dz along the Z-axis during the robotic feed arm 200 alignment and positioning process (see also FIG. 5) disclosed herein, the mounting ring is lowered into the measurement position proximate to alignment base 102 wherein the retractable plungers 194 retractable plungers pass through holes 226 and engage the top surface of positioning plate 170 as shown in FIG. 18. This engagement depresses the spring-loaded plunger 194 by an amount and a corresponding depth or distance measurement representing distance Dz is displayed either via the dials as shown or digitally in other embodiments. Any detectable twist with respect to the Y-axis indicating that the robotic feed arm 200 (vis-à-vis measurement of the positioning plate 170) is not satisfactorily level can be then corrected by fine tuning adjustment of the feed arm position.

Figure 19:
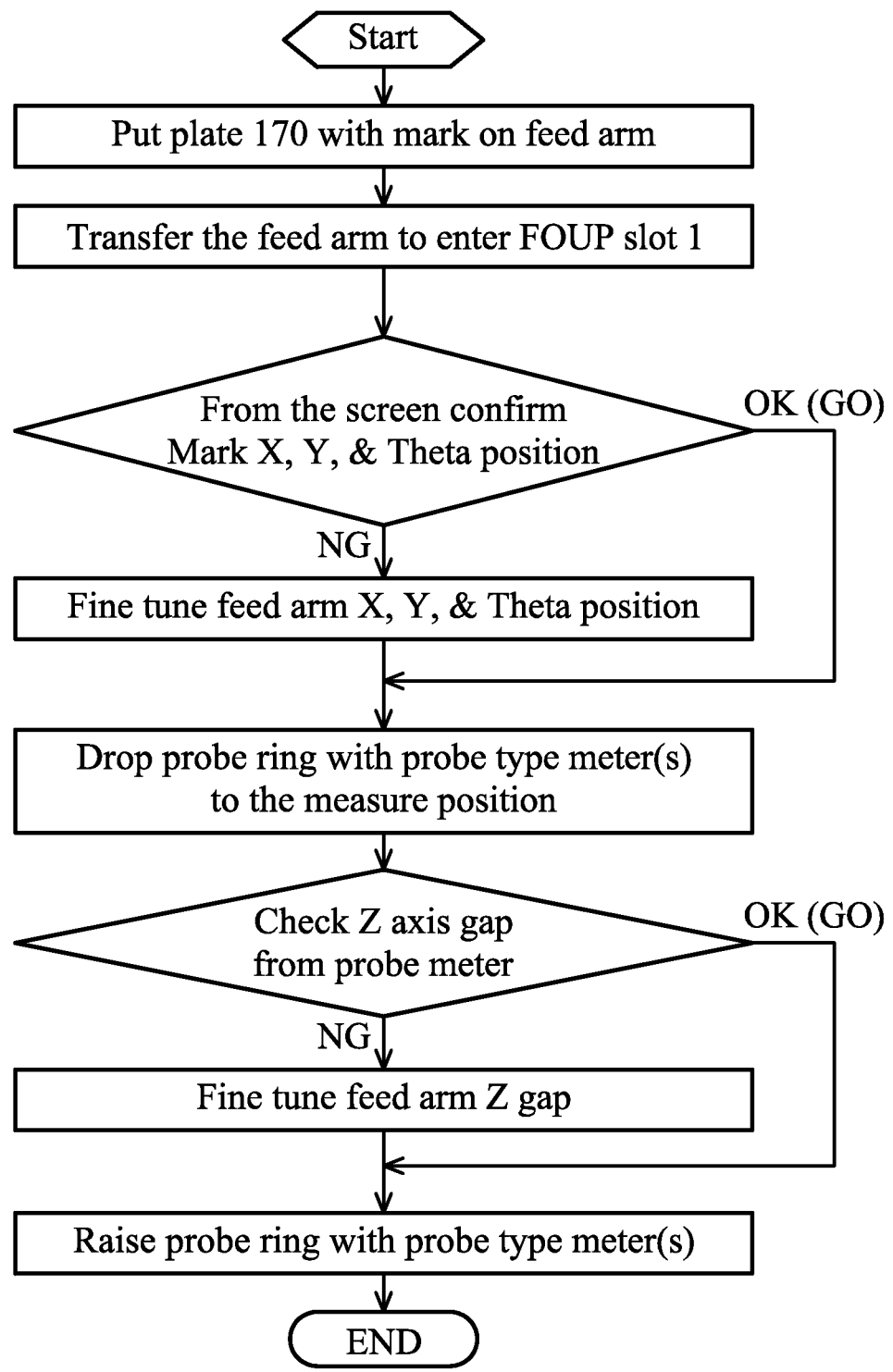
FIG. 19 is a flowchart showing a first exemplary method for adjusting the alignment and position of a feed arm associated with a wafer handling robot using an alignment apparatus and plunger depth gauge assembly of FIGS. 14-18.
Figure 20:
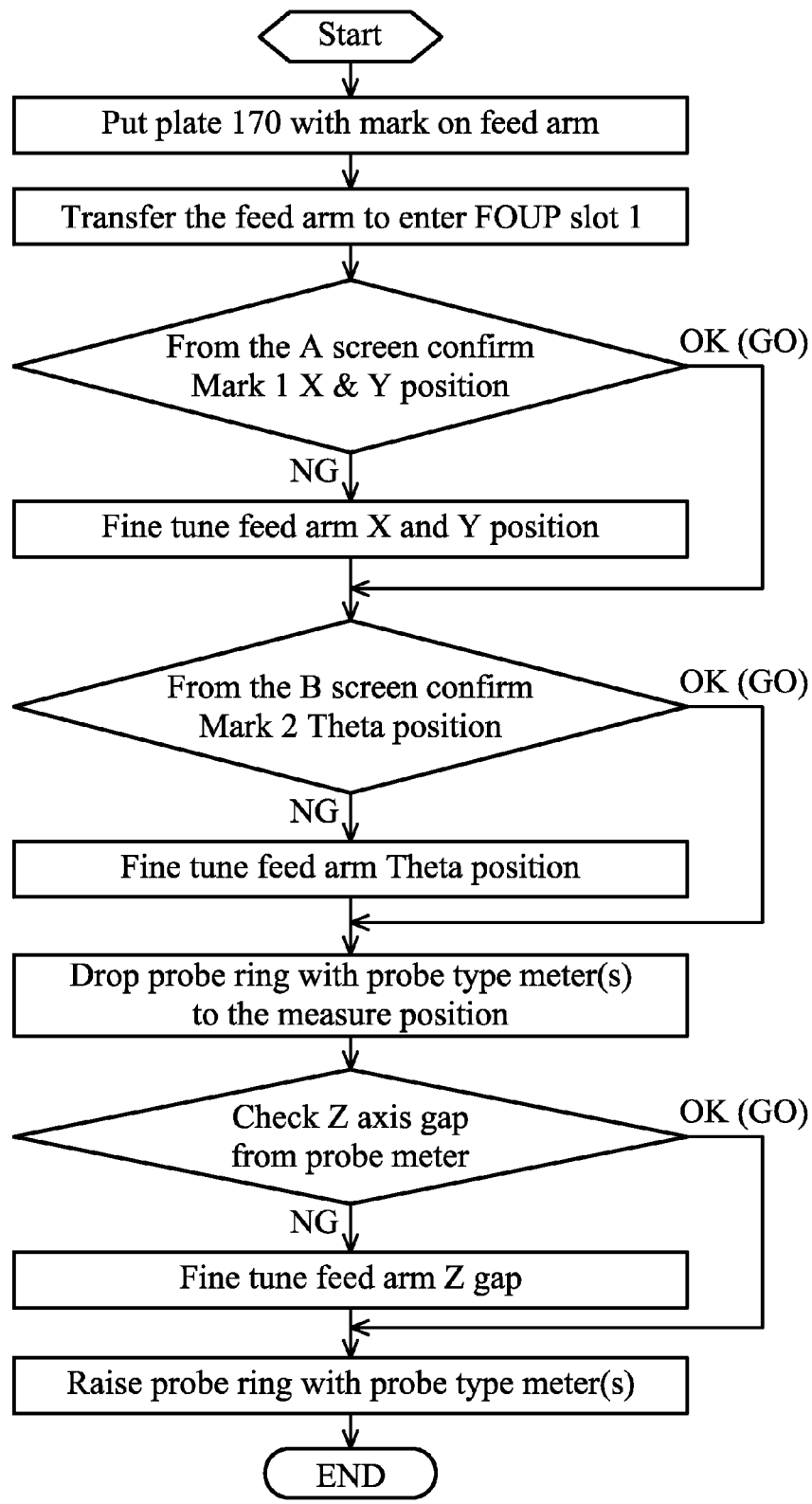
FIG. 20 is a flowchart showing a second exemplary method for adjusting the alignment and position of a feed arm associated with a wafer handling robot using an alignment apparatus and plunger depth gauge assembly of FIGS. 14-18.

Exemplary basic method steps of the foregoing alignment process using one or more depth gauges 192 in conjunction with a single digital image sensor 130 for X-axis, Y-axis, and Theta position adjustments are shown in the flowchart of FIG. 19. FIG. 20 is a similar flowchart of exemplary alignment process steps, but instead using two digital image sensors 130 for the X-axis, Y-axis, and Theta position adjustments. The process steps associated with the digital image sensors 130 are the same as already described and will not be repeated for brevity.

Figure 21:
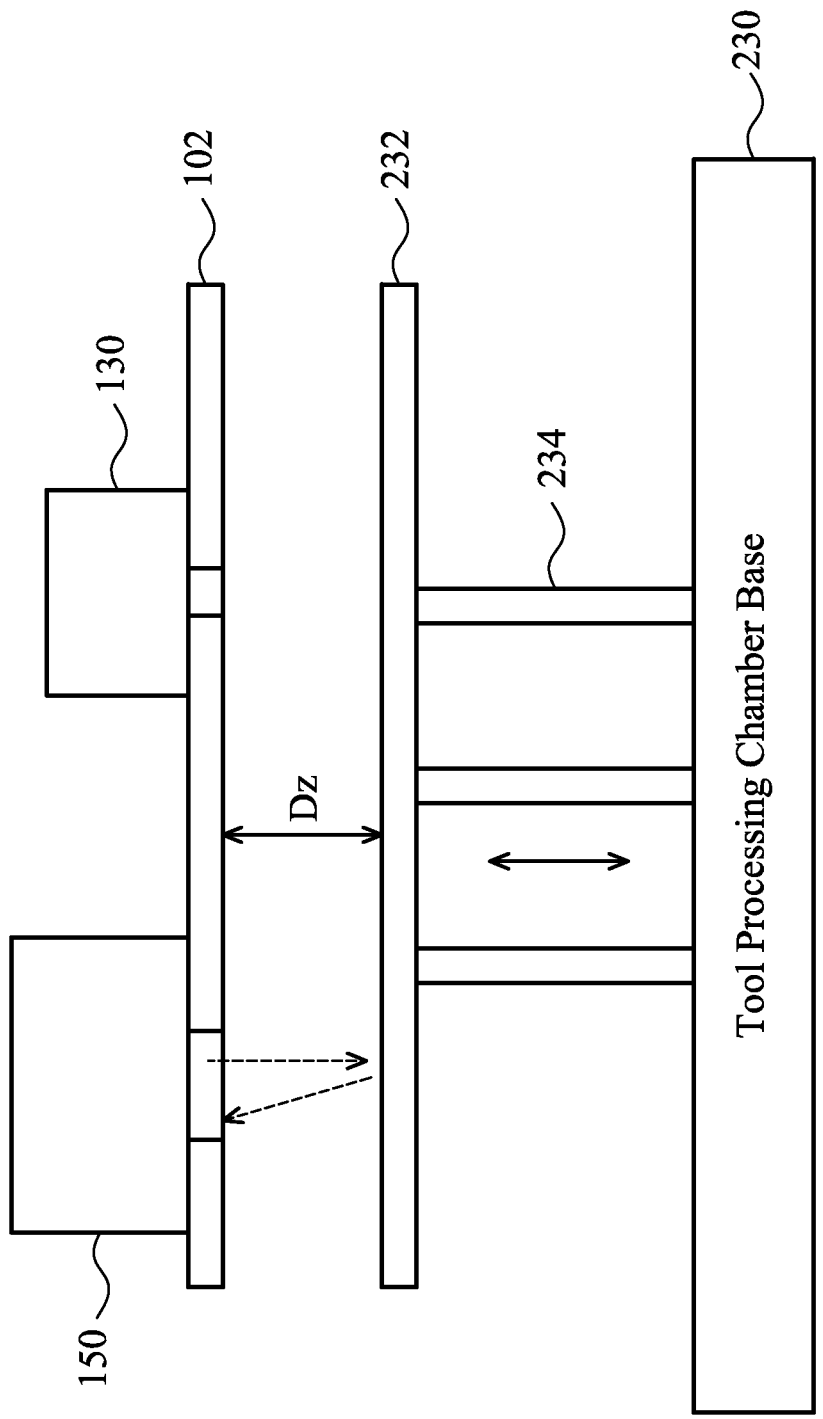
FIG. 21 is a side or elevation view of an alignment and positioning system according to the present disclosure for a robotic feed arm used to access a semiconductor tool processing chamber.

According to another aspect of the present disclosure, the non-contact electronic distance detection devices 150 (e.g. ultrasonic, infrared, laser, etc.) may be used with advantage in conjunction with initially adjusting the position and alignment of a robotic feed arm 200 in a semiconductor tool processing chamber in lieu of a FOUP as previously described herein. An exemplary setup is shown in FIG. 21 using alignment base 102 having at least one electronic distance detection device 150 mounted thereon, and optionally in some embodiments at least one digital image sensor 130. In typical fashion, the tool chamber base 230 includes three vertically movable wafer pins 234 configured and operable for holding, raising, and lowering a wafer.

With continuing reference to FIG. 21, a removable metal measurement plate 232 is provided which may be temporarily positioned and mounted on pins 234. In one embodiment, the plate is stainless steel. The measurement plate 232 serves as a surrogate for a wafer to obtain accurate Z-axis vertical distance Dz or gap measurements. Accordingly, measurement plate 232 is disc or circular shaped in one embodiment.

An exemplary method for measuring the Z-axis gap will now be described. It should be noted that tool manufacturers generally have methods and software executed by processors associated with the tool control system to accurate setup the robotic feed arm 200 X-axis, Y-axis, and Theta positions. Accordingly, the method will be used for Z-axis gap measurement alone in the present embodiment to be described.

Figure 22:
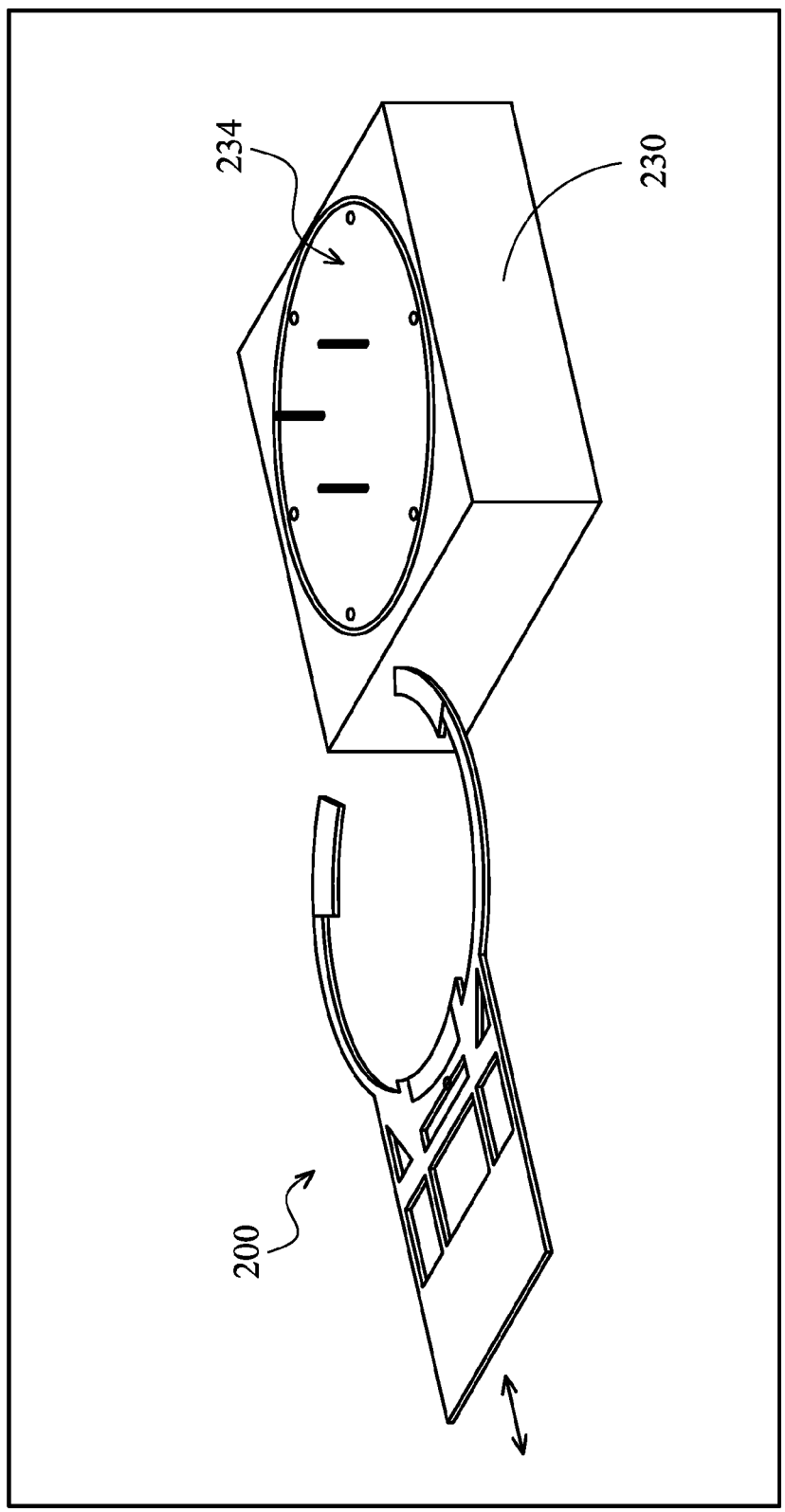
FIGS. 22-25 are perspective views of the processing chamber unit and alignment/positioning system of FIG. 21 showing sequential method steps for checking the alignment and position of the robotic feed arm.

Referring now to FIG. 22, a tool chamber base 230 and robot having a movable robot feed arm 200 are first provided with wafer pins 234 in a top position raised from the top surface of the base on which a wafer normally is seated during fabrication or other processing. This is the same position that the pins will be in when a wafer is initially loaded into the chamber.

Figure 23:
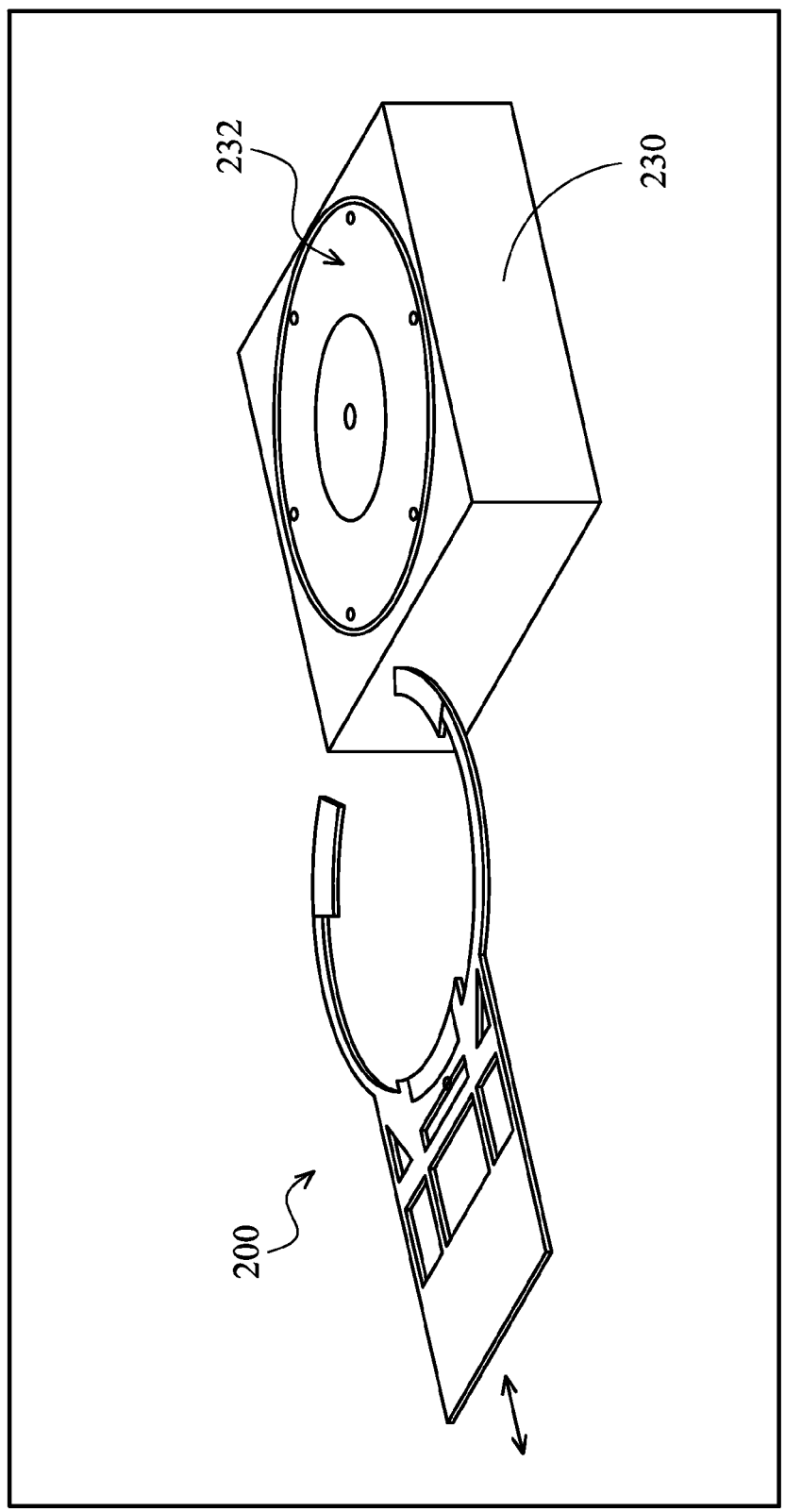
Figure 24:
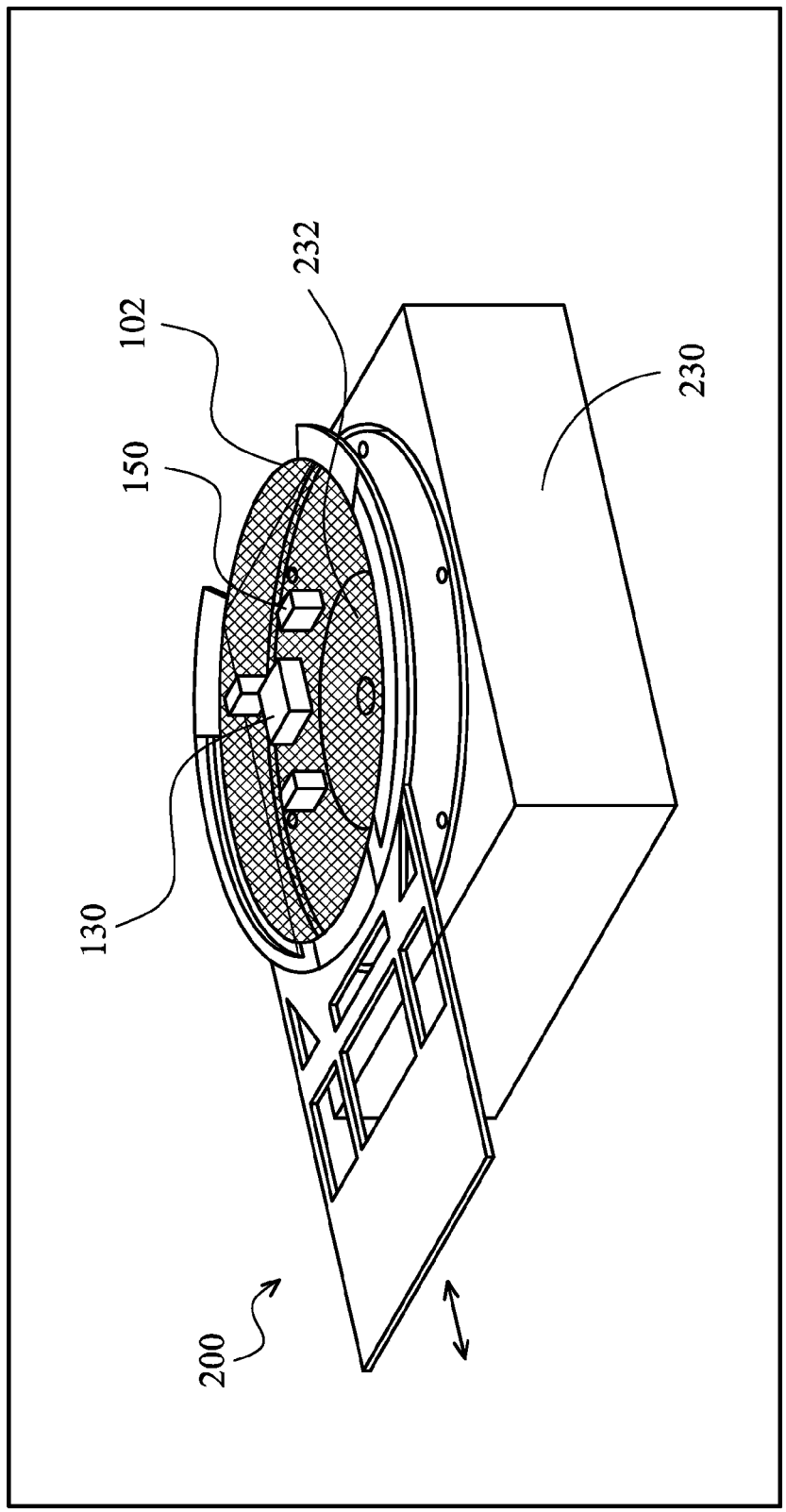

Next, measurement plate 232 is temporarily and removable placed on the wafer pins 234 and the pins are then lowered into a bottom position flush with the top surface of the chamber base 230, as shown in FIG. 23. Alignment base 102 having at least one electronic distance detection device 150 is temporarily mounted on robotic feed arm 200 as shown in FIG. 24, either at this time or prior to mounting the measurement plate 232 on the chamber base 230. The feed arm 200 with alignment plate 102 thereon is inserted into the processing chamber of the semiconductor tool and positioned above the base 230 and measurement plate 232 as shown. In this embodiment, alignment plate 102 is configured and dimensioned to match the size of the wafer anticipated to be processed in the semiconductor tool chamber since the plate 102 is mounted on the robotic feed arm instead of in the slot of a FOUP as in the embodiments previously described herein. Accordingly, the alignment plate 102 has a disc or circular shape as shown in FIG. 24.

Figure 25:
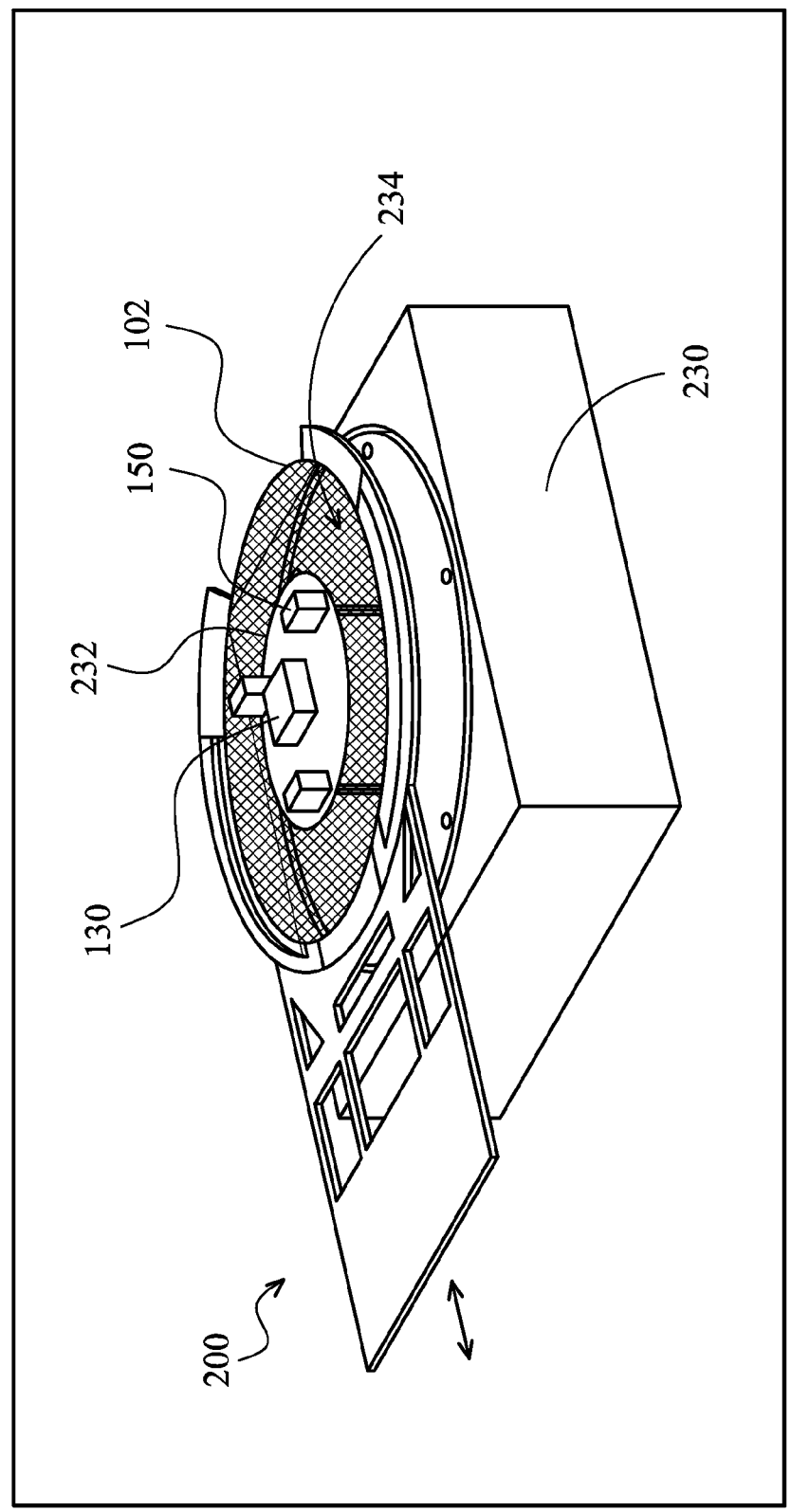

Next, measurement plate 232 is lifted to a measurement position as shown in FIG. 25 by raising wafer pins 234. In this position, the measurement plate 232 is located approximately at the same elevation as the wafer would be if held by the pins 234 during initial wafer loading into the semiconductor tool processing chamber. The distance detection device 150 is then activated and Z-axis gap measurements (i.e. distance Dz as shown in FIG. 21) are obtained between alignment base 102 and measurement plate 232. Any needed Y-axis tilt/level and gap adjustments are made to robotic feed arm 200 in the same manner previously described herein to achieve a level feed arm and satisfactory gap.

According to one aspect of the present disclosure, a system is provided for adjusting the orientation, alignment, and position of a feed arm associated with a wafer handling robot. The system includes: a wafer handling robot having an articulating robotic feed arm configured and operable for grasping a wafer, the feed arm being removably insertable into a wafer carrier having a plurality of vertically arranged horizontal slots configured for holding a wafer; a positioning plate detachably carried by the feed arm and insertable into the wafer carrier with the feed arm, the positioning plate including a graphic alignment indicia for judging the relative position and orientation of the feed arm with respect to the wafer carrier vis-à-vis the positioning plate; an alignment apparatus comprising an alignment base positionable in the wafer carrier, the alignment base comprising a flat body configured for removable insertion into the slots; and at least one electronic full array digital image sensor disposed on the alignment base, the sensor including circuitry configured and operable for capturing and displaying an image of the alignment indicia on the positioning plate on a video display monitor; wherein the position and orientation of the positioning plate in a horizontal plane with respect to the alignment base is determinable by using the alignment indicia on the positioning plate.

According to another aspect of the present disclosure, a system is provided for adjusting the orientation and position of a feed arm associated with a wafer handling robot. The system includes: a wafer handling robot having an articulating robotic feed arm configured and operable for grasping a wafer, the feed arm being removably insertable into a wafer carrier having a plurality of vertically arranged horizontal slots configured for holding a wafer; a positioning plate detachably carried by the feed arm and insertable into the wafer carrier with the feed arm, the positioning plate including a graphic alignment indicia for judging the relative position and orientation of the feed arm with respect to the wafer carrier vis-à-vis the positioning plate; an alignment apparatus comprising an alignment base positionable in the wafer carrier, the alignment base comprising a flat body configured for removable insertion into the slots; at least one first electronic full array digital image sensor disposed on the alignment base, the sensor including circuitry configured and operable for capturing and displaying an image of the alignment indicia on the positioning plate on a video display monitor, wherein the position and orientation of the positioning plate in a horizontal plane with respect to the alignment base is determinable by using the alignment indicia on the positioning plate; and at least one distance detection device configured and operable for measuring a vertical distance from the alignment base to the positioning plate when disposed in the wafer carrier.

According to another aspect of the present disclosure, a method is provided for adjusting the alignment and position of a feed arm associated with a wafer handling robot. The method includes steps of: placing an alignment apparatus in a wafer carrier having a plurality of vertically arranged horizontal slots configured for holding a wafer, the alignment apparatus having a base configured for removable insertion into the slots and at least one first electronic full array digital image sensor disposed on the base, the sensor including circuitry configured and operable for capturing and displaying an image of an object on a video display monitor; mounting a positioning plate on a feed arm of a wafer handling robot, the positioning plate including a graphic alignment indicia for judging the relative position and orientation of the feed arm with respect to the wafer carrier vis-à-vis the positioning plate; transferring the feed arm with positioning plate into the wafer carrier; displaying an image of the alignment indicia on the positioning plate on the video display monitor; and comparing the image of the alignment indicia with a reference mark superimposed on the display monitor that corresponds to a desired position and alignment of the alignment indicia in a horizontal plane. In some embodiments, if the alignment indicia and reference mark do not match in alignment and position, a further step is performed including adjusting the alignment and position of the alignment indicia by moving the robotic feed arm until a match is achieved. The method further includes in one embodiment measuring a vertical distance from the alignment base to the positioning plate with a distance detection device disposed on or proximate to the base of the alignment apparatus.

While the foregoing description and drawings represent exemplary embodiments of the present disclosure, it will be understood that various additions, modifications and substitutions may be made therein without departing from the spirit and scope and range of equivalents of the accompanying claims. In particular, it will be clear to those skilled in the art that various embodiments according to the present disclosure may be configured in other forms, structures, arrangements, proportions, sizes, and with other elements, materials, and components, without departing from the spirit or essential characteristics thereof. In addition, numerous variations in the exemplary methods and processes described herein may be made without departing from the present disclosure. The presently disclosed embodiments are therefore to be considered in all respects as illustrative and not restrictive, the scope of the claimed invention being defined by the appended claims and equivalents thereof, and not limited to the foregoing description or embodiments.

What is claimed is:

1. A system comprising:
   a positioning plate detachably mounted to a feed arm of a wafer handling robot, the positioning plate including an alignment indicia for checking the relative position and orientation of the feed arm with respect to a wafer carrier vis-à-vis the positioning plate;
   an alignment apparatus comprising an alignment base positionable in the wafer carrier having a plurality of vertically arranged horizontal slots each configured for holding a wafer, the alignment base comprising a body configured for removable insertion into the slots;
   at least one electronic digital image sensor disposed on the alignment base, the sensor including circuitry configured and operable for capturing and displaying an image of the alignment indicia on the positioning plate on a display monitor, wherein the at least one electronic digital image sensor is a camera having an optical lens facing downward and pointing through an axially aligned aperture in the alignment base,
   wherein the position and orientation of the positioning plate in a horizontal plane with respect to the alignment base is determinable by using the alignment indicia on the positioning plate; and
   a plunger depth gauge assembly mounted in the wafer carrier, the assembly including at least one plunger depth gauge attached to a mounting member suspended from a piston mechanism that is configured and operable to raise and lower the mounting member, the at least one plunger depth gauge having a retractable plunger operable to measure a vertical distance from the mounting member to the positioning plate.

2. The system of claim 1, wherein an image of the alignment indicia on the positioning plate is displayed on the monitor and superimposed with a reference mark generated by the alignment apparatus corresponding to a desired position and orientation of the alignment indicia in the horizontal plane with respect to the alignment base.

3. The system of claim 2, wherein the reference mark has a cruciform shape, the cross-hair and cruciform shape being superimposed on the monitor for comparison of their respective relative positions.

4. The system of claim 1, wherein the alignment indicia includes at least two reference lines intersecting at a 90 degree angle to form a cross-hair.

5. The system of claim 1, wherein the digital image sensor is disposed along a centerline defined by the alignment base, the centerline coinciding with a centerline of the wafer carrier.

6. The system of claim 1, wherein the positioning plate when inserted into the wafer carrier on the robotic feed arm is located below the alignment base.

7. The system of claim 1, wherein the horizontal plane is defined by an X-axis and a Y-axis associated with the alignment base.

8. The system of claim 1, wherein the digital image sensor is a CCD camera.

9. The system of claim 1, wherein the alignment base includes two spaced apart hemispherical cutouts, the digital image sensor being disposed between the openings.

10. The system of claim 1, further comprising at least one distance detection device disposed on the alignment base, the device being configured and operable for measuring a vertical distance from the alignment base to the positioning plate when disposed in the wafer carrier.

11. The system of claim 10, wherein the distance detection device is selected from a group consisting of an ultrasonic transceiver, a laser rangefinder, and an infrared distance sensor.

12. The system of claim 1, wherein the mounting member is a mounting ring.

13. The system of claim 1, further comprising a second electronic digital image sensor disposed on the alignment base, the sensor including circuitry configured and operable for capturing and displaying an image of the alignment indicia on the positioning plate on a display monitor.

14. The system of claim 1, wherein the system comprises at least two electronic digital image sensors.

15. The system of claim 1, wherein the system comprises at least two distance detection devices.

16. A system comprising:
   a positioning plate detachably mounted to a feed arm of a wafer handling robot, the positioning plate including an alignment indicia for judging the relative position and orientation of the feed arm with respect to a wafer carrier vis-à-vis the positioning plate;
   an alignment apparatus comprising an alignment base positionable in the wafer carrier having a plurality of vertically arranged horizontal slots each configured for holding a wafer, the alignment base comprising a flat body configured for removable insertion into the slots;

at least one first electronic digital image sensor disposed on the alignment base, the sensor including circuitry configured and operable for capturing and displaying an image of the alignment indicia on the positioning plate on a display monitor, wherein the position and orientation of the positioning plate in a horizontal plane with respect to the alignment base is determinable by using the alignment indicia on the positioning plate; and a plunger depth gauge assembly mounted in the wafer carrier, the assembly including at least one plunger depth gauge attached to a mounting member suspended from a piston mechanism that is configured and operable to raise and lower the mounting member, the at least one plunger depth gauge having a retractable plunger operable to measure a vertical distance from the mounting member to the positioning plate.

17. The system of claim 16, wherein an image of the alignment indicia on the positioning plate is displayed on the monitor and superimposed with a reference mark generated by the alignment apparatus corresponding to a desired position and alignment of the alignment indicia in the horizontal plane with respect to the alignment base.

18. The system of claim 17, wherein the alignment indicia includes at least two reference lines intersecting at a 90 degree angle to form a cross-hair and the reference mark has a cruciform shape, the cross-hair and cruciform shape being superimposed on the monitor for comparison of their respective relative positions.

19. The system of claim 17, wherein the alignment base is mountable on the robotic feed arm and insertable into a processing chamber of a semiconductor tool for performing alignment and distance measurements.

20. A method comprising:

placing an alignment apparatus in a wafer carrier having a plurality of vertically arranged horizontal slots configured for holding a wafer, the alignment apparatus having a base configured for removable insertion into the slots, at least one first electronic digital image sensor disposed on the base, the sensor including circuitry configured and operable for capturing and displaying an image of an object on a display monitor, wherein the at least one electronic digital image sensor is a camera having an optical lens facing downward and pointing through an axially aligned aperture in the alignment base, and a plunger depth gauge assembly mounted in the wafer carrier, the assembly including at least one plunger depth gauge attached to a mounting member suspended from a piston mechanism that is configured and operable to raise and lower the mounting member, the at least one plunger depth gauge having a retractable plunger operable to measure a vertical distance from the mounting member to the positioning plate;

mounting a positioning plate on a feed arm of a wafer handling robot, the positioning plate including an alignment indicia for judging the relative position and orientation of the feed arm with respect to the wafer carrier vis-à-vis the positioning plate, the positioning plate detachably mounted to the feed arm;

transferring the feed arm with the positioning plate into the wafer carrier;

displaying an image of the alignment indicia on the positioning plate on the display monitor; and comparing the image of the alignment indicia with a reference mark superimposed on the display monitor that corresponds to a desired position and alignment of the alignment indicia in a horizontal plane.

21. The method of claim 20, wherein if the alignment indicia and reference mark do not match in alignment and position, a further step is performed comprising adjusting the alignment and position of the alignment indicia by moving the robotic feed arm until a match is achieved.

22. The method of claim 20, further comprising a step of measuring a vertical distance from the alignment base to the positioning plate with a distance detection device disposed on or proximate to the base of the alignment apparatus.

* * * * *